(12) United States Patent
Coumou et al.

(10) Patent No.: US 8,781,415 B1
(45) Date of Patent: Jul. 15, 2014

(54) DISTORTION CORRECTION BASED FEEDFORWARD CONTROL SYSTEMS AND METHODS FOR RADIO FREQUENCY POWER SOURCES

(71) Applicant: MKS Instruments, Inc., Andover, MA (US)

(72) Inventors: David J. Coumou, Webster, NY (US); Larry J. Fisk, Fairport, NY (US)

(73) Assignee: MKS Instruments, Inc., Andover, MA (US)

( * ) Notice: Subject to any disclaimer, the term of this patent is extended or adjusted under 35 U.S.C. 154(b) by 2 days.

(21) Appl. No.: 13/761,679

(22) Filed: Feb. 7, 2013

(51) Int. Cl.
*H04B 1/04* (2006.01)
*H01Q 11/12* (2006.01)
*H04K 1/02* (2006.01)
*H04L 25/03* (2006.01)
*H04L 25/49* (2006.01)
*H03F 1/26* (2006.01)
*H03F 1/30* (2006.01)

(52) U.S. Cl.
USPC ......... 455/114.3; 455/125; 375/297; 330/149

(58) Field of Classification Search
USPC ............ 455/107, 114.2, 114.3, 125; 375/296, 375/297; 330/149, 302, 305; 333/17.3, 32; 323/364
See application file for complete search history.

(56) References Cited

U.S. PATENT DOCUMENTS

| | | | |
|---|---|---|---|
| 2,745,067 A | 5/1956 | True et al. | |
| 3,117,279 A | 1/1964 | Ludvigson et al. | |
| 3,443,231 A | 5/1969 | Roza | |
| 3,601,717 A | 8/1971 | Kuecken | |
| 5,493,252 A * | 2/1996 | Takai | 330/52 |
| 6,252,354 B1 | 6/2001 | Collins et al. | |
| 6,417,732 B1 | 7/2002 | Radomski et al. | |
| 7,839,223 B2 | 11/2010 | Van Zyl et al. | |
| 8,217,731 B2 | 7/2012 | McKinzie, III | |
| 8,576,013 B2 * | 11/2013 | Coumou | 330/305 |
| 2004/0132470 A1 * | 7/2004 | Checoury et al. | 455/501 |
| 2008/0061901 A1 | 3/2008 | Gilmore | |
| 2008/0158076 A1 | 7/2008 | Walley | |
| 2008/0274706 A1 | 11/2008 | Blin | |
| 2009/0278512 A1 | 11/2009 | Karlicek et al. | |
| 2012/0086519 A1 * | 4/2012 | Hauer et al. | 333/125 |
| 2012/0208476 A1 * | 8/2012 | Tanoue et al. | 455/95 |

FOREIGN PATENT DOCUMENTS

EP 0677221 A1 10/1995

* cited by examiner

*Primary Examiner* — Nguyen Vo

(74) *Attorney, Agent, or Firm* — Harness, Dickey & Pierce, P.L.C.

(57) ABSTRACT

A distortion module includes a first module, at least one module and a correction module. The first module is configured to (i) receive radio frequency signals from radio frequency sensors of a power amplifier, and (ii) generate a distortion signal indicating distortion values for the radio frequency signals. The radio frequency signals are indicative of radio frequency power out of the power amplifier and received by a transmission line. At least one module is configured to estimate a phase of the distortion signal. The phase of the distortion signal is indicative of a phase of the transmission line. The correction module is configured to generate a distortion correction signal based on the phase to correct at least one of the distortion values of the radio frequency signals.

22 Claims, 12 Drawing Sheets

DISTORTION CORRECTION BASED FEEDFORWARD CONTROL SYSTEMS AND METHODS FOR RADIO FREQUENCY POWER SOURCES

FIELD

The present disclosure relates to a radio frequency (RF) generator and, more particularly, to tuning control of a RF generator.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A RF power system may include a RF power supply (or RF generator), a matching network and a load. Guided search techniques may be used for impedance tuning the RF power supply and/or the matching network. Impedance tuning is performed to match, for example, an input impedance of the matching network to an impedance of a transmission line between the RF power supply and the matching network. This impedance matching maximizes an amount of power forwarded to the matching network and minimizes the amount of power reflected back from the matching network to the RF power supply.

An example method for impedance tuning includes coarse and fine frequency tuning the RF power supply. An objective of a frequency tuning algorithm is to determine a frequency such that a magnitude of a reflection coefficient of the RF power supply is at a minimum value. The smaller the reflection coefficient, the less power that is reflected back to the RF power supply. FIG. 1 illustrates reflection coefficient responses based on coarse and fine tuning of the RF power supply. In FIG. 1 a reflection versus frequency curve is shown. Coarse frequency hops are indicated by arrows 1-5 and fine frequency hops are indicated by arrows 6-8. For an operating frequency range $F_{Max}$-$F_{Min}$ of the RF power supply, a minimum magnitude of the reflection coefficient is at a tune frequency $F_{Tune}$. The tune frequency $F_{Tune}$ is located between two approximately flat (approximately zero slope) regions of the reflection coefficient versus frequency curve. The flat regions may have a reflection coefficient value of one.

Typically, a frequency tuning algorithm may include a heuristic technique to adjust the frequency to the tune frequency $F_{Tune}$. The heuristic technique commences with a first course frequency hop as indicated by arrow 1. The first coarse frequency hop may be performed in either direction. Based on the resulting reflection coefficient, a next coarse frequency hop is performed. Since the first frequency hop decreases the frequency of the RF power, increases the reflection coefficient, and increases the amount of reflected power, the first coarse frequency hop is not in the correct direction (i.e. towards $F_{Tune}$). The guided-search method continues with a determination that the decrease in frequency was inappropriate and the next course frequency hop is performed to increase the frequency of the RF power supply. This can return the RF power supply to an initial condition. As a result, multiple frequency hops are performed, which decreases RF power efficiency (ideally, reverse power is zero and all of the RF power is applied to the load) and increases tuning time. For this reason, a frequency tuning algorithm may be enhanced with an initial predetermined direction of a frequency hop to provide a more efficient path toward the minimum reflection coefficient.

The guided-search method produces subsequent course frequency hops that increase the frequency of the RF power supply. The action of increasing the frequency causes both the magnitude of the reflection coefficient and reverses power to decrease. The guided-search method continues to increase the frequency with course updates until a predetermined tune threshold is passed. When the guided-search method passes the predetermined tune threshold, the next frequency hop is in a reverse direction and is a fine frequency hop to proceed toward the tune frequency $F_{Tune}$. A result of driving the frequency past the tune frequency $F_{Tune}$ there is an increase in the magnitude of the reflection coefficient and an increase in reverse power, which decreases RF power efficiency and increases tuning time. The guided-search method may continue to reverse the direction and size of frequency hops until the predetermined tune threshold is met. The frequency tuning may require multiple passes of the predetermined tune threshold and/or the tune frequency $F_{Tune}$ before being completed.

FIG. 2 provides an example illustrating effects on reverse power associated with coarse and fine frequency tuning adjustments. In FIG. 2 a reverse power versus tuning time curve is shown. Coarse frequency hops are indicated by arrows 9-13. Fine frequency hops are indicated by arrows 14-16. FIG. 2 illustrates multiple passes of the tune frequency $F_{Tune}$ before completing tuning. The reverse power may not be at a minimum level as shown in FIG. 2 when the frequency tuning is completed. This is because the tuning is completed when the predetermined tune threshold is no longer passed and/or is met, which may not result in the frequency of the power amplifier being at the tune frequency $F_{Tune}$.

SUMMARY

A distortion module is provided and includes a first module, at least one module and a correction module. The first module is configured to (i) receive radio frequency signals from radio frequency sensors of a power amplifier, and (ii) generate a distortion signal indicating distortion values for the radio frequency signals. The radio frequency signals are indicative of radio frequency power out of the power amplifier and received by a transmission line. At least one module is configured to estimate a phase of the distortion signal. The phase of the distortion signal is indicative of a phase of the transmission line. The correction module is configured to generate a distortion correction signal based on the phase to correct at least one of the distortion values of the radio frequency signals.

In other features, a distortion module is provided and includes a function module, a first derivative module, a second derivative module, and a correction module. The function module is configured to (i) receive radio frequency signals from radio frequency sensors of a power amplifier, and (ii) generate a distortion signal indicating distortion values for the radio frequency signals based on a distortion function. The first derivative module configured to, based on the distortion values of the distortion signal, determine first derivative values of a first derivative of the distortion function or the distortion signal to generate a first derivative signal. The second derivative module is configured to, based on the first derivative values or the first derivative signal, determine second derivative values of a second derivative of the distortion signal to generate a second derivative signal. The phase module is configured to (i) determine a first phase of the first derivative signal and a second phase of the second derivative signal, and (ii) determine a first phase correction value based on the first phase and the second phase. The correction module is configured to generate a distortion correction signal based on the first phase correction value.

In other features, a radio frequency system is provided and includes a power amplifier, a sensor, a distortion module, a derivative module, a gain module, and a control module. The power amplifier is configured to output a radio frequency signal to a matching network via a transmission line between the power amplifier and the matching network. The sensor is configured to monitor the radio frequency signal and generating first sensor signals based on the radio frequency signal. The distortion module is configured to determine distortion values according to at least one of (i) a sinusoidal function of the first sensor signals and (ii) a cross-correlation function of the first sensor signals. The derivative module is configured to determine derivative values for a derivative of a distortion function based on the distortion values. The gain module is configured to determine a gain value based on the derivative values to account for a resolution of an impedance tune space associated with the transmission line. The control module is configured to (i) generates an impedance tuning value based on the distortion values and the gain value, and (ii) provides feedforward control of impedance matching performed within the matching network including outputting the impedance tuning value to one of the power amplifier and the matching network.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
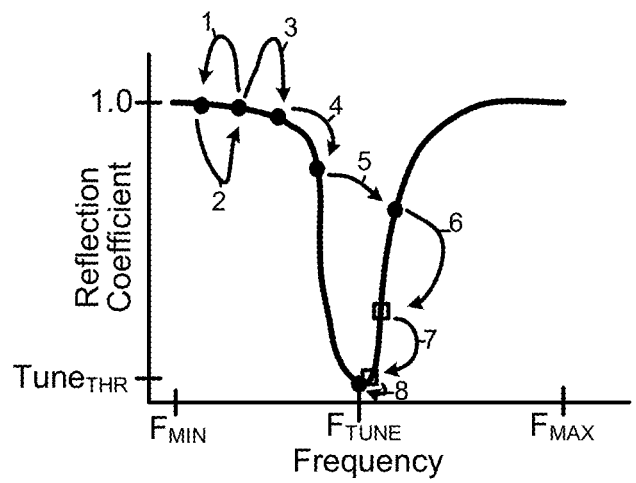
FIG. 1 is a reflection coefficient versus frequency plot associated with a traditional guided-search method.
Figure 2:
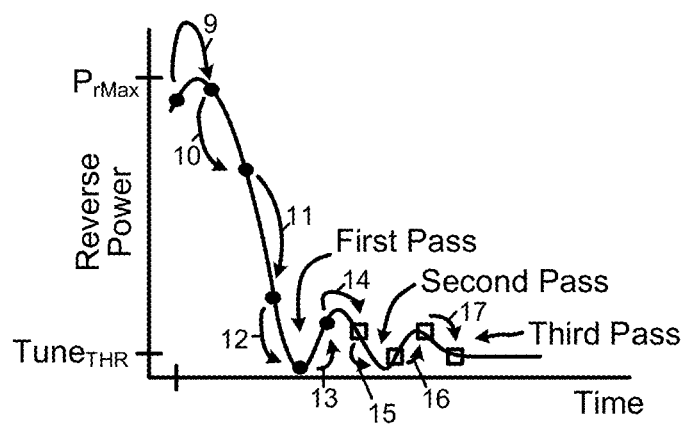
FIG. 2 a reverse power versus tuning time plot associated with a traditional guided-search method.

Deficiencies of the guided-search method for frequency tuning can be extended to matching network tuning algorithms. Matching network tuning may be performed to tune an impedance of a matching network as described above. Both frequency tuning and matching network tuning share a mutual objective of impedance matching such that a maximum amount of RF power is transferred from a RF power supply to a load. The quicker that impedances are matched and the fewer steps performed and/or guided conditions checked, the more efficient the tuning method. For example, a tuning method may include determining when a peak point of operation has been met (e.g., frequency of RF power supply matches tune frequency $F_{Tune}$) and indicating when a condition of peak power transfer no longer exists. These conditions may be checked to determine whether further tuning is required. In U.S. patent application Ser. No. 13/339,494, feedforward tuning techniques are disclosed that eliminate the need to check these conditions.

The feedforward tuning techniques include correcting power disturbance by adjusting frequency, load and tune actuators for impedance matching. The corresponding adjustment of these actuators, or a subset of these actuators, corrects the power disturbance for maximum and efficient RF power transfer. The feedforward tuning techniques include an automated calibration process to adjust operations of control modules to compensate for transmission line effects on RF power transfer. Calibration processes are performed to compute frequency, tune and load corrections to compensate for changes in a phasor associated with transmission line effects. The transmission line effects can impair geometrical orientations of signals originating from RF sensors, which can increase reflected power and reduce an amount of power transferred.

Two approaches can be performed for obtaining a maximum amount of power transfer between an RF generator and a transmission line, where the transmission line is used to provide power to a dynamic load. The first approach is performed by a first RF power system (shown in FIG. 3) and includes an RF power generator connected to a matching network with at least two tuning elements. The RF power generator adjusts the position (or impedance) of the tuning elements to adjust an impedance of the matching network to provide a maximum amount of power transfer. The tuning elements can include variable load and tune capacitors of the matching network. The second approach may be performed by a second RF power system (shown in FIG. 4), which uses agile frequency of the RF generator to adjust impedance seen by the RF generator.

Feedforward power control methods are disclosed below and in U.S. patent application Ser. No. 13/339,494 that include frequency, tune capacitor position and load capacitor position (or impedance) actuators. The impedance actuators are updated to correct power distortion, which can prevent a RF power system from transferring a maximum amount of power with minimal reflected power. The power control methods determine power distortion based on signals from RF sensors located in a RF power generator. The power control methods may be dependent on normalizing a ratio of outputs of RF sensors to yield $\cos\theta + j\sin\theta$, where $\theta$ is a phase angle between the outputs of the RF sensors.

For example, if a RF sensor is a type VI sensor, power distortion d may be computed as a ratio by relationship $$d = \frac{\vec{z}}{|z|} = e^{j\theta},$$

where $$\vec{z} = \frac{\vec{v}}{\vec{i}}|z|e^{j\theta},$$

z is impedance of the transmission line, v is a voltage output as detected by the RF sensors, and i is a current output as detected by the RF sensors. If the RF sensor is a directional coupler, power distortion d is computed as a ratio by relationship $$d = \frac{\vec{\Gamma}}{|\Gamma|} = e^{j\theta},$$

where $$\vec{\Gamma} = \frac{\vec{P_r}}{\vec{P_r}} = |\Gamma|e^{j\theta},$$

$\Gamma$ is a reflection coefficient, $P_r$ is reverse power, and $P_f$ is forward power. In this normalized form, the feedforward control module performs a correction by applying an imaginary quantity ($d_j = d_i = \sin\theta$) to the tune or frequency impedance actuators (or tune and frequency elements), and a real quantity ($d_j = \cos\theta$) is used to apply a correction to the load impedance actuator. Directly, determination of impedance (in the case of the VI sensor) or the reflection coefficient (in the case of the directional coupler) is not required. The angular component $\theta$ may be determined instead.

The following described techniques include enhancements to the above-described control method and include adaptation of parameters of control modules. The adaptation of these parameters alleviates manual intervention to initiate a corresponding calibration process. Coefficients of the control modules are adapted for improved tuning performance.

Figure 3:
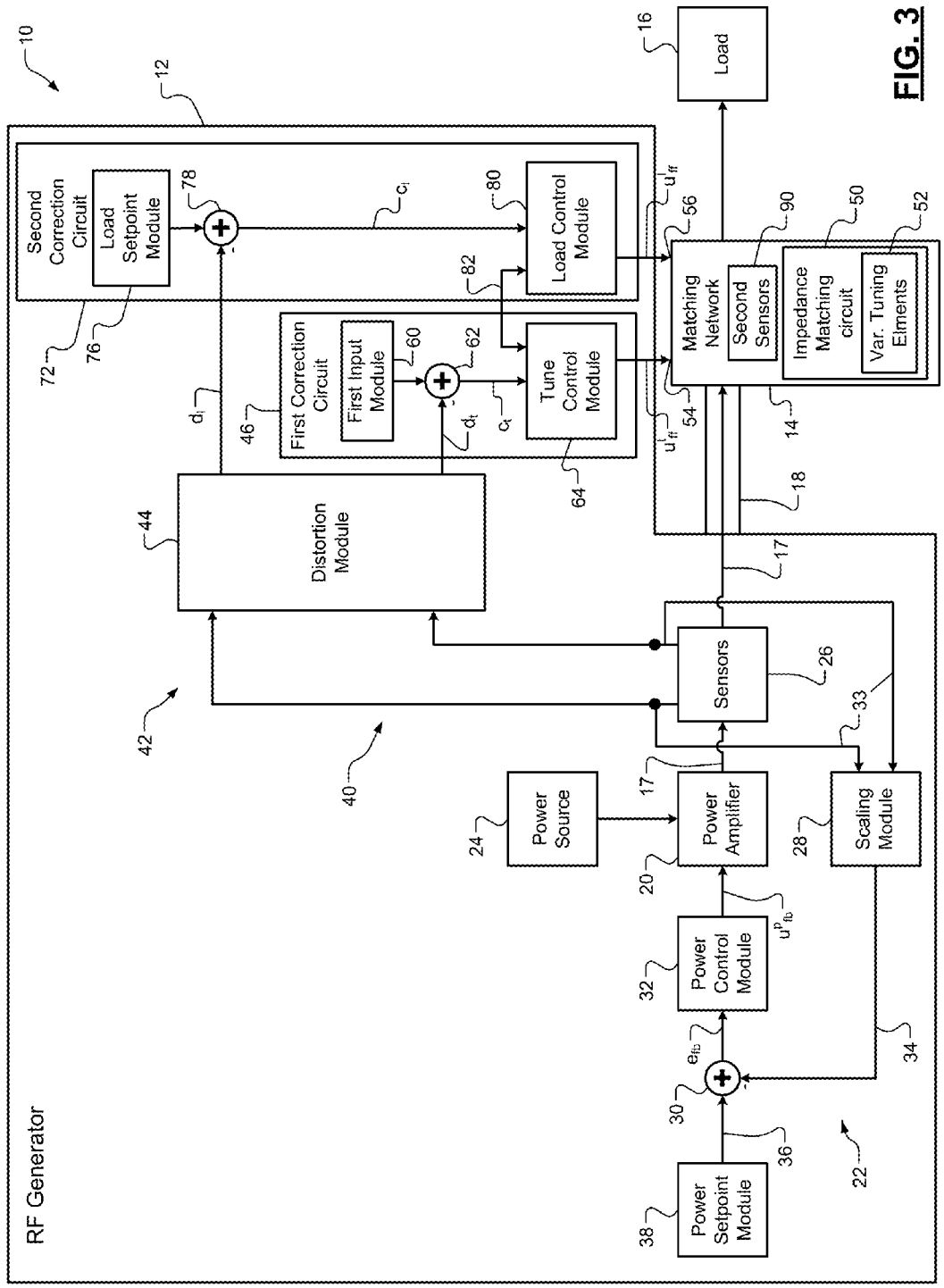
FIG. 3 is a functional block diagram of a RF power system incorporating feedforward control in accordance with the present disclosure.

In FIG. 3, a RF power system 10 is shown. The RF power system 10 includes a RF generator 12, a matching network 14, and a load 16 of the matching network 14. The RF generator 12 generates a RF power signal 17, which is provided to the matching network 14. The matching network 14 matches an input impedance of the matching network 14 to a characteristic impedance of a transmission line 18 between the RF generator 12 and the matching network 14. Put another way, the matching network 14 matches an impedance of the load 16 to an impedance as seen by the output of the RF generator 12. The matching network 14 and the load 16 may be considered as the load on the RF generator 12. The load 16 may be, for example, a plasma chamber or other RF load. The impedance of the load 16 may be static (i.e. unchanging over time) or dynamic (i.e. changing over time).

The RF generator 12 includes a RF power source 20 (or a power amplifier) and a feedback loop 22. The power amplifier 20 generates the RF power signal 17, which is outputted to the matching network 14. The power amplifier 20 may generate the RF power signal 17 based on a power signal received from a power source 24 external to the power amplifier 20. Although the power source 24 is shown as part of the RF generator 12, the power source 24 may be external to the RF generator 12. The power source 24 may be, for example, a direct current (DC) power source.

The feedback loop 22 includes one or more sensors (first sensors) 26, a scaling module 28, a first summer 30, and a power control module 32. The sensors 26 may include voltage, current and/or directional coupler sensors. The sensors 26 may detect (i) voltage V and current/output of the power amplifier 20, and/or (ii) forward (or source) power $P_{FWD}$ out of the power amplifier 20 and/or RF generator 12 and reverse (or reflected) power $P_{REV}$ received from the matching network 14. The voltage V, current I, forward power $P_{FWD}$, and reverse power $P_{REV}$ may be scaled and/or filtered versions of the actual voltage, current, forward power and reverse power of the output of the power amplifier 20. The sensors 26 may be analog and/or digital sensors. In a digital implementation, the sensors 26 may include analog-to-digital (A/D) converters and signal sampling components with corresponding sampling rates.

The sensors 26 generate sensor signals 33, which are received by the scaling module 28. The scaling module 28 scales the sensor signals 33 and generates a power feedback signal 34. The power feedback signal 34 is generated based on the sensor signals 33 and a scaling matrix. The power feedback signal 34 may represent the forward power for forward power leveling deliver power. The power feedback signal 34 may represent the RF power transferred to the matching network 14 or load power $P_d$ and can be represented by equation 1, where V is voltage output of the power amplifier 20 and/or RF generator 12, I is current out of the power amplifier 20 and/or RF generator 12, and $\Theta$ is a phase difference between the voltage and the current outputs V, I of the power amplifier 20.

$$P_d = |V||I|\cos(\Theta) = P_{FWD} - P_{REV} \quad (1)$$

The first summer 30 sums the power feedback signal 34 with a predetermined power setpoint signal 36, which may be generated by a power setpoint module 38. The power feedback signal 34 may be subtracted from the predetermined power setpoint signal 36 to generate an error signal $e_{fb}$.

The power control module 32 receives the error signal $e_{fb}$, and generates a power control signal $u_{fb}^P$ to regulate power out of the power amplifier 20. The power control signal $u_{fb}^P$ is provided to the power amplifier 20. The power amplifier 20 adjusts the RF power signal 17 based on the power control signal $u_{fb}^P$. The RF power signal 17 may be a continuous waveform or a pulsed waveform. The servo control described herein allows for the RF power signal 17 to be pulsed due to the update rate associated with the servo control. The power control module 32 may include a proportional integral derivative (PID) controller and/or a direct digital synthesis (DDS) component(s). In one implementation, the power control module 32 is a first PID controller with a function identified as $D_{fb}^P(z)$. The power control signal $u_{fb}^P$ may be a drive signal and have a DC offset or rail voltage, a frequency and a phase. However, the power control signal $u_{fb}^P$ does not adjust frequency of the RF power signal 17.

The RF generator 12 may further include a first feedforward loop 40 and a second feedforward loop 42. The first feedforward loop 40 includes a distortion module 44 and a first correction circuit 46. The distortion module 44 determines a distortion value $d_t$ (referred to as d or $d_i$ with respect to FIGS. 5-13 below) representative of the distortion as seen at the output of the power amplifier 20 and/or RF generator 12. The first distortion value $d_t$ is generated based on the sensor signals 33 and a distortion function. The distortion function is described in more detail below. The first correction circuit 46 generates a first power tuning value (or first impedance tuning value) $u_{ff}^t$ a based on the first distortion value $d_t$. The tuning value $u_{ff}^t$ is provided to the matching network 14 for frequency response tuning and impedance adjusting purposes. The distortion module 44 may determine the first distortion value $d_t$ based on a sinusoidal function and/or a cross-correlation function.

Sinusoidal Function

Multiple techniques are disclosed herein that include maximizing optimal power transfer in an RF power system with a dynamic load (i.e. a load having varying impedance(s)). A first technique, which is described with respect to FIG. 3 includes the RF power source 24 connected to the matching network 14. The matching network 14 may include an impedance matching circuit 50 with two or more variable tuning elements 52 (e.g., variable capacitors). The variable tuning elements 52 may be in a 'L'-configuration (one capacitance in parallel with the RF generator 12 and one capacitance in series with the load 16). The variable tuning elements 52 are used for adjusting tune and load parameters of the matching network 14, and may have respectively an associated tune input 54 and load input 56. The tune and load parameters refer to impedance adjustments performed in the matching network 14 via the variable tuning elements 52. As an example, the tune parameter and the load parameter may be associated with respective capacitances of capacitors in the matching network 14.

Figure 4:
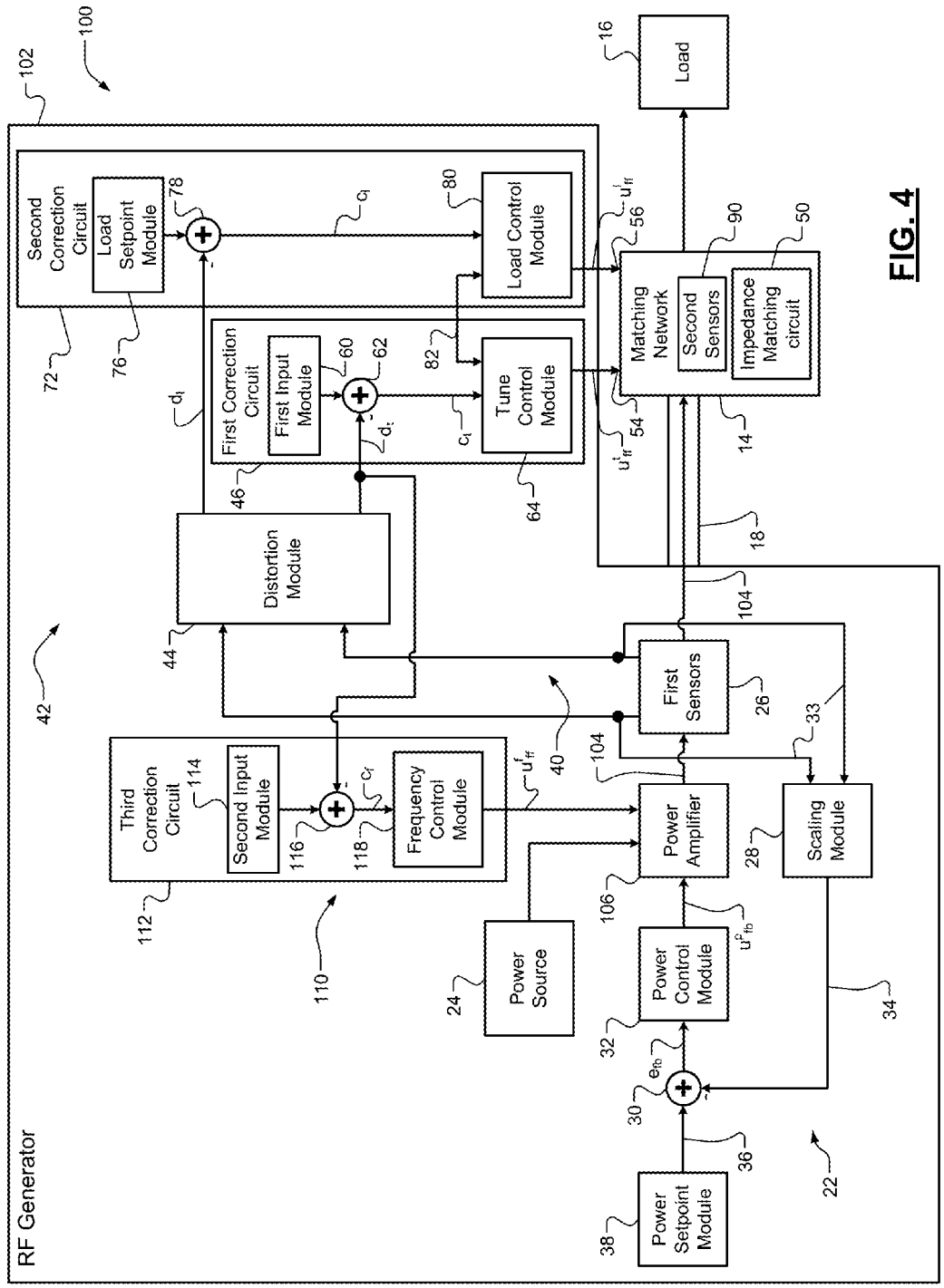
FIG. 4 is a functional block diagram of a RF power system incorporating feedforward control and power correction feedback control in accordance with the present disclosure.

A second technique, which is described with respect to FIG. 4, introduces a variable frequency adjustment to the power amplifier 20 and may be used alternatively or in combination with the first technique. The tune and load parameters may each be fixed, discretely selectable, and/or adjustable when using the second technique.

In both the first and second techniques, the RF power transferred $P_d$ from the power amplifier 20 to the matching network 14 is maximized. This may occur when the forward power $P_{FWD}$ to the matching network 14 is maximized and/or the reverse power $P_{REV}$ from the matching network is minimized. The RF power transferred $P_d$ may be represented by equation 2. A maximum RF power transferred $P_{MAX}$ may be represented by equation 3.

$$P_d = |V||I|\cos(\theta) \quad (2)$$

$$P_{MAX} = \max(|V||I|\cos(\Theta)) = \max(P_{FWD}) - \min(P_{REV}) \quad (3)$$

The RF power transferred $P_d$ is maximized when the phase $\Theta$ is as close to zero as systematically achievable for a RF power system 10 providing power to a reactive load or reactive impedance (e.g., the load 16). A reactive impedance refers to a load with changing impedance. The first and second techniques minimize the phase $\Theta$ by adjusting the tune and load parameters of the matching network 14. Since the phase $\Theta$ is dependent on the reactive impedance, reduction in the phase $\Theta$ is a function of frequency f of the power amplifier 20. As a result, phase reduction can be performed as a function of the frequency f or in other words, the phase $\Theta$ can be reduced to or nearly 0 by adjusting the frequency f of the power amplifier 20 and thus the output frequency f of the power amplifier 20. Frequency adjustment is provided by the implementations of FIG. 4.

Although the first and second techniques can be used to minimize the phase $\Theta$, the techniques do not directly detect or adjust the phase $\Theta$. The techniques may include determining $\cos(\Theta)$ (referred to herein as "the cosine function"), $\sin(\Theta)$ or $1-\sin^2\Theta$ (referred to herein as "the sine function"), and/or another primary and/or sinusoidal function. The phase $\Theta$ may be referred to as a secondary function. The first distortion value $d_t$ is determined via the distortion module 44 using vector calculus without determining the phase $\Theta$. The first distortion value $d_t$ may be equal to and/or be represented by the sinusoidal function.

As an example, the cosine function $\cos(\Theta)$ for two independent variables X, Y may be represented by, for example, equation 4, where X may be voltage or reverse power, Y may be current or forward power, and $\langle XY \rangle$ is a dot product of X and Y.

$$\cos(\Theta) = \frac{\langle XY \rangle}{\|X\|_2 \|Y\|_2} \quad (4)$$

The sine function $1-\sin^2\Theta$ may be determined based on one of the equations 5 and 6.

$$\sin(\Theta) = \frac{\langle X \otimes Y \rangle}{\|X\|_2 \|Y\|_2} \quad (5)$$

$$\sin(\Theta) = \frac{(|X||Y| - \langle XY \rangle)^{\frac{1}{2}}}{\|X\|_2 \|Y\|_2} \quad (6)$$

One technique disclosed herein includes maximizing power transfer to the matching network 14 by maximizing the cosine function $\cos(\Theta)$. As an example, the variables X and Y may be substituted for voltage V and current I, and $\cos(\Theta)$ may be calculated directly using a closed form solution to control the frequency f of the power amplifier 20. The cosine function is maximized to maximize the power transferred. This technique may be performed digitally using, for example, digital circuitry and/or a PID controller.

An example analog technique includes using directional coupler sensors to detect the reverse power $P_{REV}$ and the forward power $P_{FWD}$. The variable X of expression 4 may be replaced with the reverse power $P_{REV}$ and the variable Y of expression 4 may be replaced with the forward power $P_{FWD}$. A reflection coefficient $\Gamma$ of the transmission line 18 is a function of the reverse power $P_{REV}$ and the forward power $P_{FWD}$. The reflection coefficient $\Gamma$ may be represented by the reverse power $P_{REV}$ divided by the forward power $P_{FWD}$ and or by equation 7, where $z_l$ is the impedance of the load on the RF generator 12 (i.e. the matching network 14 and the load 16) and $z_0$ is the impedance of the transmission line 18.

$$\Gamma = \frac{z_l - z_0}{z_l + z_0} \quad (7)$$

The techniques disclosed herein enable autonomous servo of an agile frequency RF power source (power amplifier 20) for maximized power transfer. Although servo control includes feedback and feedforward control, the feedforward control provided herein aids in quickly maximizing the power transferred to the matching network 14. These techniques include determining distortion of a RF power system (RF power system 10) and providing feedforward correction using vector calculus. The distortion refers to the reflected power due to the reactive change in load impedance, which is directly related to the sinusoidal function of the phase $\Theta$.

Cross Correlation

As an alternative to and/or in addition to using a sinusoidal function, a cross-correlation function may be used to determine the first distortion value $d_t$. The energy of a signal s(t) may be represented by equation 8 using vector calculus, where t is time.

$$s(t) = \int_{-\infty}^{\infty} s^2(t) \, dt \qquad (8)$$

To compute energy for a change in load impedance or an arc disturbance of a load, the energy exhibited by a RF power system is based on two parameters. The two parameters may be determined based on signals from RF sensors (such as the sensors 26). The RF sensors may be, for example, voltage and current sensors or directional coupler sensors that are used to acquire voltage, current and/or power samples of a transmission line. Signals from the RF sensors are oscillating continuous time signals, which may be arbitrarily designated as x(t) and y(t), which correspond to the above variables X and Y. The corresponding digital version of these oscillating continuous time signals is x(n) and y(n). A discrete-time cross correlation value $r_{xy}(\tau)$ of the signals x(n) and y(n) may be represented by equation 9, where, $\mu_x$ represents the average of the signal x(n), $\mu_y$ represents the average of the signal y(n), and $\tau$ represents an overlap of and/or shift in time between the signals x(n) and y(n).

$$r_{xy}(\tau) = \sum_{\forall n} (x[n] - \mu_x)(y[n - \tau] - \mu_y) \qquad (9)$$

Power p associated with the two signals x(n) and y(n) can be determined when $\tau$ is equal to 0. The two signals x(n) and y(n) completely overlap in time when $\tau$ is equal to 0. Energy $E_{xy}$ for an impedance changing event can be represented by equation 10 and as a function of the power p, where b identifies a block number, $T_b$ is a duration time of each block, K is a total of non-overlapping blocks of samples of the two signals x(n) and y(n), and k identifies a current block and/or sample.

$$E_{xy} = T_b \sum_{k=1}^{K} (p[k] - p[k-1]) \qquad (10)$$

The dot product <XY> may be determined based on the cross-correlation value when $\tau$ is equal to 0. The dot product <XY> is directly related to the cross-correlation value when $\tau$ is equal to 0. Also, the power p (or $P_d$) is related to the dot product <XY> by substituting equation 2 into equation 4. Based on the discrete-time cross correlation value $r_{xy}(2)$, the power p (or $P_d$), and the dot product <XY> the distortion value of the sinusoidal function (e.g., the cosine function or the sine function) may be determined based on vector calculus.

The distortion module 44 may determine the first distortion value d, based on the discrete-time cross correlation value $r_{xy}(\tau)$ when $\tau$ is not equal to 0. The distortion module 44 may not determine the first distortion value d, based on the discrete-time cross correlation value $r_{xy}(\tau)$ when $\tau$ is equal to 0. As shown above, this cross-correlation technique may be used to derive a sinusoidal function between two wideband signals x(t) (e.g., V or $P_{REV}$) and y(t) (e.g., I or $P_{FWD}$), which is representative of characteristics of the transmission line 18.

The sinusoidal function may be used as described below for autonomous control of a variable frequency RF power source to maximize power transfer. The sinusoidal function is used in feedforward control to correct distortion impinged on power regulation when the frequency of the RF power source (or power amplifier) achieves a power transfer that is less than a maximum power transfer. This correction is immune to spectral interference due to harmonics or intermodulation distortion. For this reason, this technique is useful for dynamic load conditions and RF power applications requiring frequency tuning responses of a RF power source within a predetermined period (e.g., less than 3 microseconds (µs)) with a predetermined update rate (e.g., less than 1 µs). Frequency tuning of a RF power source is described primarily with respect to FIG. 4.

Referring again to FIG. 3, in one implementation, the first correction circuit 46 includes a first input module 60, a second summer 62 and a tune control module 64 (or $D_{\!f\!f}^t(z)$). The first input module 60 may generate a first predetermined value (e.g., 0 when determining the distortion value $d_t$ according to the sine function or 1 when determining the distortion value $d_t$ according to the cosine function). The second summer 62 may subtract the first distortion value $d_t$ from the first predetermined value to generate a tuning or first correction value $c_t$. The tune control module 64 may include a second PID controller and generate a power tuning value (or first impedance tuning value) $u_{\!f\!f}^t$ based on the first correction value $c_t$. The tune control module 64 may adjust the impedance tuning value $u_{\!f\!f}^t$ to match the first distortion value $d_t$ with the first predetermined value. The tune control module 64 may generate and/or receive the first predetermined value.

The second feedforward loop 42 may include the distortion module 44 and a second correction circuit 72. The distortion module 44 determines a ratio of magnitudes (or second distortion value) $d_l$ based on the sensor signals 33 and a second distortion function. The second distortion function may be represented by equation 11.

$$d_l = \frac{\|X\|_2}{\|Y\|_2} \qquad (11)$$

The first and second distortion values $d_t, d_l$ each provide an indication of distortion and/or associated parameters, as measured by the sensors 26.

The second correction circuit 72 may include a load setpoint module 76, a third summer 78 and a load control module 80, which may be represented as a function $D_{\!f\!f}^l(z)$. The load setpoint module 76 may generate a predetermined load setpoint value (e.g., 50 Ohms($\Omega$)). The third summer 78 may subtract the second distortion value $d_l$ from the load setpoint value to generate a load correction value (second correction value) $c_l$.

The load control module 80 may include a third PID controller and may generate a power load value (or second impedance tuning value) $u_{\!f\!f}^l$ based on the second correction value $c_l$. The load control module 80 may adjust the power load value $u_{\!f\!f}^l$ to match the second distortion value $d_l$ to the load setpoint value. The load control module 80 may generate and/or receive the load setpoint value.

The tune control module 64 and the load control module 80 are coupled, as represented by arrow 82. The arrow 82 represents a mutual coupling between the tune and the load inputs 54, 56 of the matching network 14. The power load value $u_{\!f\!f}^{\,l}$ is affected (or indirectly adjusted) when the power tune value $u_{\!f\!f}^{\,t}$ is directly adjusted by the tune control module 64. Similarly, the power tune value $u_{\!f\!f}^{\,t}$ is affected (or indirectly adjusted) when the power load value $u_{\!f\!f}^{\,l}$ is directly adjusted by the load control module 80. The tune and load inputs 54, 56 are adjusted respectively by the power tune value $u_{\!f\!f}^{\,t}$ and the power load value $u_{\!f\!f}^{\,l}$.

The matching network 14 may also include second sensors 90. The second sensors 90 may include phase and magnitude sensors, which are used by the impedance matching circuit 50 to adjust the tune and load inputs 54, 56. The impedance matching circuit 50 may adjust the tune and load inputs 54, 56 such that the load 16 and the matching network 14 have an impedance as seen by the power amplifier 20 and/or the RF generator 12 matching the impedance of the transmission line 18. The tune and load inputs 54, 56 may be adjusted until phase of the RF power signal 17 is 0 and impedance of the matching network 14 is at a predetermined impedance (e.g., 50Ω). This aids in minimizing the reverse power $P_{REV}$, which maximizes power transferred to the matching network 14. The second sensors 90 may be electrically coupled to the transmission line 18 and used to detect the distortion (or $P_{REV}$) of the RF power system 10. The tune and load adjustments performed by the impedance matching circuit 50 based on the outputs of the second sensors 90 do not need to fully maximize the power transferred, as the feedforward loops 40, 42 further aid in maximizing the power transferred.

The second sensors 90 may be located at an input of the matching network 14, not at an output of the matching network 14 to quantify the distortion of the RF power system 10 as a function of the reverse power $P_{REV}$. The impedance matching circuit 50 may apply a feedforward match correction $u_{\!f\!f}^{\,m}$ to correct an impedance mismatch between the matching network 14 and the transmission line 18. Collective power transfer contributions by the power control module 32 and the matching network 14 (and/or controller of the matching network 14) to power delivery may be analytically represented as a vector u including the compensation (power regulation) and correction (matching network tuning) values provided by these controllers. This vector is represented by equation 12.

$$u = [u_{f\!f\!b}^{\,p}\; u_{\!f\!f}^{\,m}] \tag{12}$$

The tune and load control modules 64, 80 provide the distortion corrections values $u_{\!f\!f}^{\,t}$ and $u_{\!f\!f}^{\,l}$ which are provided to the tune and load inputs 54, 56. The match correction value $u_{\!f\!f}^{\,m}$ may be expressed as a vector including quantities, as represented by equation 13.

$$u_{\!f\!f}^{\,m} = [u_{\!f\!f}^{\,t}\; u_{\!f\!f}^{\,l}] \tag{13}$$

Without the distortion correction of the matching network 14, there can be a loss in the RF power system 10 if feedback control is used without feedforward control. The second sensors 90 may be coupled to the transmission line 18 to measure impedance or a reflection coefficient, which may be used to minimize the reverse power $P_{REV}$. The second sensors 90 may be referred to as phase and/or magnitude detectors. The matching network 14 may not correct all of the distortion, as other feedforward control is provided via the feedforward loops 40, 42. The matching network 14 may adjust the tune and load inputs 54, 56 based on the measured impedance or reflection coefficient. The distortion correction as performed by the matching network 14 may be limited and may not reduce the reverse power $P_{REV}$ to 0 due to model imperfections and/or a measurement error. The feedforward correction provided by the feedforward loops 40, 42 may further correct the distortion and reduce the reverse power $P_{REV}$ to 0.

To reduce the number of sensors incorporated in the RF power system 10, the first sensors or the second sensors may not be included. The remaining sensors included in the RF power system 10 and the corresponding signals and/or parameter actuators are accessible to the RF generator 12 and the matching network 14. As an example, sensor and controller consolidation may be achieved by deploying power delivery feedforward correction within the RF generator 12.

Autonomous Control of Agile RF Power Source

The phase of the signals x(t) and y(t) has a relationship, which may be represented by equation 14, where W is equal to the dot product <XY>.

$$W = \|X\|_2 \|Y\|_2 \cos(\Theta) \tag{14}$$

The cosine function may be used to represent distortion upon which feedforward correction is based. This feedforward correction may be used when the sensors used to determine the distortion value of the cosine function are (i) voltage and current sensors or (ii) directional coupler sensors. As an example, the voltage and current signals are in phase when the load impedance matches the characteristic impedance of the transmission line 18.

Based on the complex reflection coefficient Γ, which is a ratio of the reverse power $P_{REV}$ to the forward power $P_{FWD}$, a phase difference between the reverse power $P_{REV}$ and the forward power $P_{FWD}$ is minimized and/or $P_{REV}$ is reduced to 0. When voltage and current sensors are used, a phase difference between the voltage and phase signals is also minimized and/or reduced to 0. This leads to a control law represented by equation 15, wherein $\cos(\Theta)_d$ is a desired or predetermined value and $\cos(\Theta)_a$ is an actual and/or calculated value.

$$\cos(\Theta)_d - \cos(\Theta)_a = 1 - \cos(\Theta)_a \tag{15}$$

Minimizing the phase difference between the sensor signals minimizes and/or reduces the distortion to 0.

In a directional coupler sensor implementation, it is feasible for an offset to occur in a primary conductance circle from an admittance grid of a Smith chart. The primary conductance circle refers to a circle that passes through an origin in a complex reflection coefficient grid of the Smith chart. The load of the matching network 14 is set such that the tune input 54 when adjusted causes the reflection coefficient Γ as mapped to a unit circle of the Smith chart to follow a conductance circle and pass through the origin. At the origin, the impedance of the matching network 14 matches the characteristic impedance of the transmission line 18.

As another example, the frequency of the power amplifier 20 may be servo controlled to adjust the impedance and/or reflection coefficient Γ to an intersection of a real axis of the Smith chart in a complex plane of the reflection coefficient Γ. Frequency adjustment of the power amplifier 20 is described below with respect to FIG. 4. For a directional coupler sensor implementation, the phase difference is adjusted to ±π. Taking advantage of the symmetrical nature of the cosine function, the control law is revised and may be represented by equation 16.

$$\cos(\Theta)_d - \cos(\Theta)_a = 1 - |\cos(\Theta)_a| \tag{16}$$

For a voltage and current sensor implementation, the primary conductance circle may not intersect the origin and exhibit a rotational offset due to systematic variation in the RF power system 10 and the load to be matched. The cosine function may be reduced to a non-zero value producing a small error in $\cos(\Theta)_d - \cos(\Theta)_a$. This is one of several benefits in contrast to measuring the phase directly.

For an expedient search to a maximum power transfer state, the feedforward control follows a trajectory along the conductance circle to minimize the distance to the origin and to assure that the origin is reached or the real axis is intersected near the origin. Since the feedforward control includes using vector calculus to measure the cosine function including determining a ratio of magnitudes of X and Y, a quantitative measure of directivity is provided. The ratio of magnitudes provides a quantitative measure for directivity. Directivity may refer to a tuning direction or a direction in which a correction value is adjusted, and be based on an increasing or decreasing distortion value.

The use of the sine function instead of the cosine function can also provide directivity. The cosine function does not directly imply directivity, whereas the sine function does, as the output of the sine function may be compared to 0 and the output of the cosine function may be compared to 1. Equation 13 may be modified as follows to provide directivity. Both sides of equation 4 may be squared to provide $\cos^2(\Theta)$. The square of the cosine function $\cos^2(\Theta)$ is equal to 1 minus the square of the sine function $(1-\sin^2(\Theta))$. The control law provided by equation 16 may then be modified as shown by equation 17.

$$\cos(\Theta)_d - \cos(\Theta)_a = 1 - |\sin^2(\Theta)_a| \qquad (17)$$

When directional coupler sensors are used, impedance of the matching network 14 and/or frequency of the power amplifier 20 may be adjusted such that the ratio of magnitudes is reduced to a minimum value. Reducing the ratio of magnitudes indicates that the impedance and/or frequency adjustments are tending to a maximum power transfer. As an alternative to and/or in addition to determining the ratio of the magnitudes, a magnitude of the reverse power $P_{REV}$ may be monitored and minimized. When voltage and current sensors are used, the impedance and/or frequency adjustments are performed such that the ratio of the magnitudes tends to the characteristic impedance of the transmission line 18.

As described herein, techniques are provided to correct a power mismatch using servo tunable elements based on a ratio of magnitudes of RF sensor outputs and a sinusoidal calculation based on the RF sensor outputs. Although the update rate is faster in a digital sampling system than for mechanically tunable circuit elements, analog components may be used for a frequency tunable power source.

Instead of or in addition to adjusting the tune and load inputs 54, 56, frequency of the power amplifier 20 may be adjusted within a predetermined frequency range. Agile frequency control may be provided using feedforward control complementing feedback power control. If the load impedance of the RF generator 12 varies, the power control module 32 may not be able to correct for this change and/or may be limited in correcting for this change. By determining the sinusoidal function, an estimate of the distortion imposed by an impedance disturbance is determined. To further correct for the change in load, the frequency drive of the power amplifier and/or the frequency of the RF power signal may be adjusted based on the sinusoidal function to further counter the reactive distortion to the load. This is described in further detail below with respect to FIG. 4.

In FIG. 4, a RF power system 100 is shown. The RF power system 100 includes a RF generator 102, the matching network 14 with the impedance matching circuit 50 and the second sensors 90, and the load 16. The RF generator 102 generates a RF power signal 104, which is provided to the matching network 14. The RF generator 102 includes a RF power source (or a power amplifier) 106 and the feedback loop 22. The power amplifier 106 generates the RF power signal 104, which is an output to the matching network 14. The power amplifier 106 may generate the RF power signal 104 based on (i) a power signal received from the power source 24 external to the power amplifier 106, and/or (ii) a frequency tuning value $u_{ff}^f$. The power source 24 may be, for example, a direct current (DC) power source.

The feedback loop 22 includes the sensors 26, the scaling module 28, the first summer 30, and the power control module 32. The sensors 26 generate the sensor signals 33, which are received by the scaling module 28. The scaling module 28 scales the sensor signals 33 and generates the power feedback signal 34. The power feedback signal 34 is generated based on the sensor signals 33 and the scaling matrix. The first summer 30 sums the power feedback signal 34 with the predetermined power setpoint signal 36, which may be generated by the power setpoint module 38. The power feedback signal 34 may be subtracted from the predetermined power setpoint signal 36 to generate the error signal $e_{fb}$.

The power control module 32 receives the error signal $e_{fb}$ and generates the power control signal $u_{fb}^P$ to regulate power out of the power amplifier 106. The power amplifier 106 adjusts the RF power signal 104 based on the power control signal $u_{fb}^P$ and the frequency tuning value $u_{ff}^f$. The RF power signal 104 may be a pulsed waveform and have a frequency set based on the frequency tuning value $u_{ff}^f$.

The RF generator 12 may further include the first feedforward loop 40, the second feedforward loop 42, and a third feedforward loop 110. The RF power system 10 may include the third feedforward loop 110 and not the first and second feedforward loops 40, 42 or may include the first, second and third feedforward loops 40, 42, 110, as shown. The first feedforward loop 40 includes the distortion module 44 and the first correction circuit 46 with the first input module 60, the second summer 62 and the tune control module 64. The second feedforward loop 42 may include the distortion module 44 and the second correction circuit 72 with the load setpoint module 76, the third summer 78 and the load control module 80.

Although the third feedforward loop 110 may have the appearance of a feedback loop, the third feedforward loop 110 performs as a feedforward loop and performs a feedforward function and is thus referred to herein as a feedforward loop. The third feedforward loop 110 provides the frequency tuning value $u_{ff}^f$, which is used to adjust frequency of the RF power signal 104. By adjusting the frequency of the RF power signal 104, frequency responses of the matching network 14 changes, which alters impedances in the matching network 14. These impedance changes affect impedance matching between the matching network 14 and the transmission line 18, which affects the amount of reverse power $P_{REV}$ and the amount of power transferred $P_d$.

The third feedforward loop 110 includes the distortion module 44 and a third correction circuit 112. The third correction circuit 112 includes a second input module 114, a fourth summer 116 and a frequency control module 118, which may be represented as a function $D_{ff}^f(z)$. The second input module 114 generates a third predetermined value (e.g., 1). The fourth summer 116 may subtract the distortion tuning value $d_t$ from the third predetermined value to generate a third correction value $c_f$. The frequency control module 118 may include a fourth PID controller and generate the frequency tuning value $u_{ff}^f$ based on the third correction value $c_f$. The frequency control module 118 may adjust the frequency tuning value $u_{ff}^f$ to match the first distortion value $d_t$ to the third predetermined value. The frequency control module 118 may generate and/or receive the third predetermined value.

Figure 5:
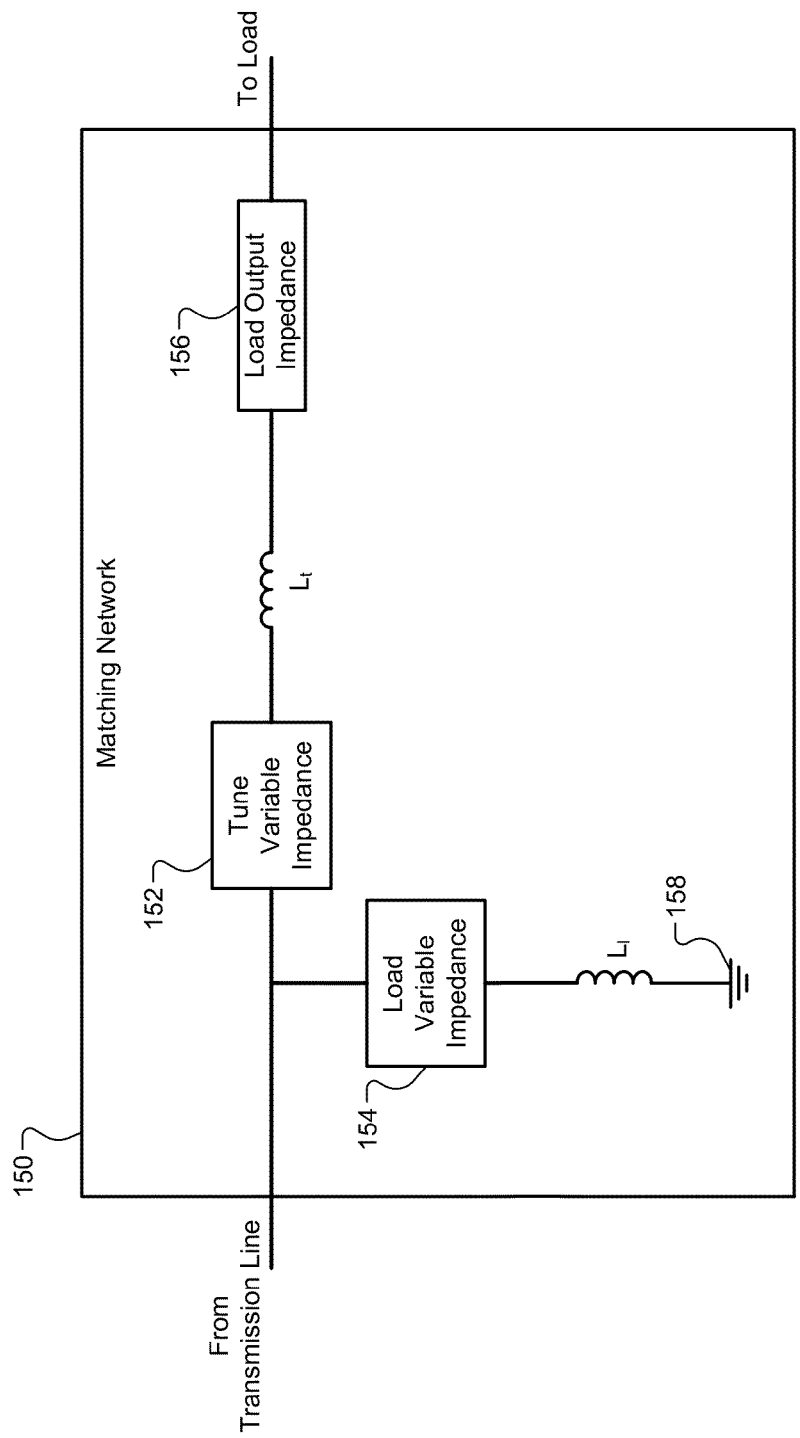
FIG. 5 is a functional block and schematic diagram of a matching network.

Referring also to FIG. 5, an example matching network 150 is shown, which may be used to replace the matching network 14 of FIGS. 3-4. The matching network 150 may include a tune variable impedance 152, a load variable impedance 154, and a load output impedance 156. The tune variable impedance 152 may be connected to a transmission line (e.g., the transmission line 18). The tune variable impedance 152 may include a first variable capacitance. Impedance of the tune variable impedance and/or capacitance of the first variable capacitance may be adjusted based on the impedance tuning value $u_{ff}^t$. The load variable impedance 154 may be connected to the transmission line and the tune variable impedance 152. The load variable impedance may include a second variable capacitance. Impedance of the load variable impedance and/or capacitance of the second variable capacitance may be adjusted based on the power load value $u_{ff}^l$.

The matching network 150 may further include a load inductance $L_l$ and a tune inductance $L_t$. The load inductance $L_l$ may be connected between the load variable impedance 154 and a ground reference 158. The tune inductance $L_t$ may be connected between the tune variable impedance 152 and the load output impedance 156. The load output impedance 156 may be connected between the tune inductance $L_t$ and the load 16.

The above-described feedforward techniques send a power tuning value and a load tuning value to a matching network for tuning elements of the matching network and/or a frequency tuning value to a power amplifier. These feedforward techniques are dependent on normalizing an impedance measurement to yield cos θ+j sin θ, where θ is the phase angle between sensor output signals. In this normalized form, control modules perform corrections by using (i) an imaginary quantity to apply a correction to a tune element or a frequency element, and (ii) a real quantity to apply a correction to the load element.

The feedforward techniques may not include determining transmission line impedance. The phase angle θ may simply be determined based on a relationship for impedance and a relationship for a normalized distortion ratio. The impedance relationship is $$\vec{z} = \frac{\vec{v}}{\vec{i}} |z| e^{j\theta}.$$

The relationship for normalized distortion ratio is $$d = \frac{\vec{z}}{|z|} = e^{j\theta}.$$

This normalized distortion ratio can include a square root function in a denominator term. An alternate normalization procedure includes determining distortion based on $$d = \frac{\vec{z} - x}{\vec{z} + x} \approx e^{j\theta}$$

for a suitable complex quantity x. The complex quantity x is further defined as a matrix below. The alternate normalization procedure alleviates use of the square root function for processing RF sensor signals.

Processing of the RF sensor signals to determine the distortion d is dependent on the orientation of the complex quantity x in a complex plane. Ideally, the trajectory of d lies in a left-hand portion of the complex plane (i.e., left of a real zero axis of the complex plane and referred to as the left-hand plane) and an intersection of the trajectory with the real zero axis occurs at a location for maximum power transfer. This intersection corrects the tune impedance element in the matching network or the frequency element of a RF generator for maximum power transfer. Impedance of a transmission line between the RF generator and the matching network affects the trajectory of the distortion d. Variation in velocity of propagation $V_p$ and/or length l of the transmission line can rotate orientation of a path of the distortion d, which is indicated by phase φ. The phase φ may be equal to, for example, $$\frac{30.5 l f}{V_p}.$$

The length l alone does not fully characterize the effect of the transmission line between the RF generator and the matching network. The phase φ increases proportionally with frequency f and inversely proportionally with the velocity of propagation $V_p$. More importantly to the feedforward control techniques is the rotational effect the transmission line has on the normalization procedure. Impedance transformation may not be performed when performing the feedforward control techniques. The rotational effect caused by the transmission line is corrected by estimating a phasor $\hat{\phi}$ of the transmission line and applying this to provide a distortion correction using the relationship $d_c = d e^{-j(\hat{\phi}+\pi)}$. The distortion correction $d_c$ is applied such that the trajectory path of the distortion correction $d_c$ is contained in the left-hand plane. The estimation of phasor $\hat{\phi}$ may also include systematic effects contributed by RF sensors and associated signal processing circuitry. RF sensor signals $\vec{v}$ and $\vec{i}$ may be signals that are calibrated to a common reference plane and used to determine the distortion d.

Figure 6:
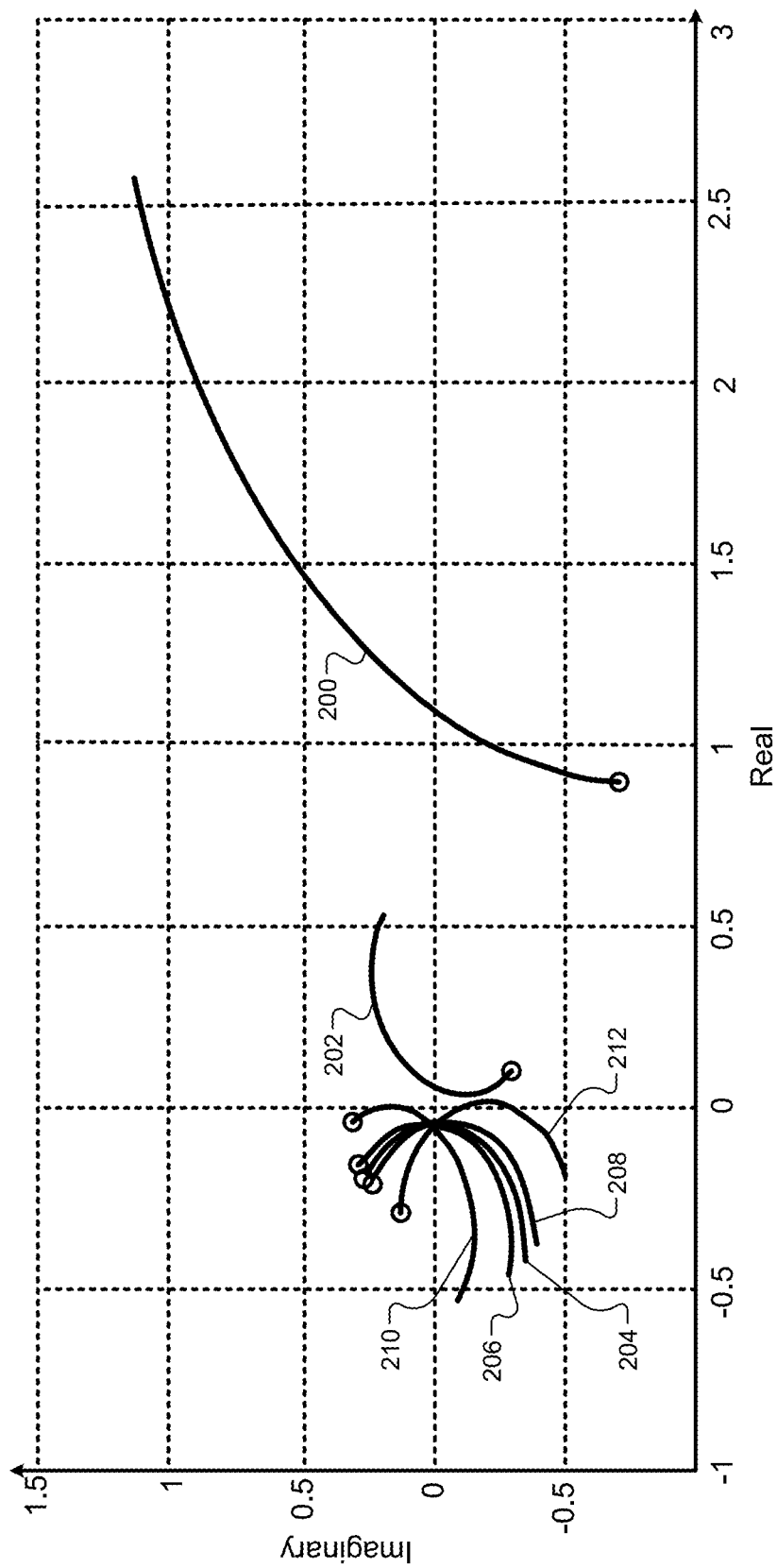
FIG. 6 is a plot of impedance variability and distortion function variability in accordance with the present disclosure.

FIG. 6 shows a plot of impedance variability and distortion function variability. A distortion function can vary for various reasons, which are disclosed below. The rotational effect of a transmission line between a RF generator and a matching network is shown in FIG. 6. Trace 200 is the trajectory of impedance $\vec{z}$ of the transmission line with a circle on the trajectory being associated with a minimum frequency of an operating bandwidth. Each of the other curves in FIG. 6 are associated with a respective distortion function and include a circle corresponding to the minimum frequency of the operational bandwidth. Trace 202 shows a distortion function without phasor correction for the transmission line. Trace 204 is the distortion function with a phasor correction applied along with a distortion correction $d_c$. Traces 206, 208 show a minimum and maximum range for distortion correction for a first or minimum phase variability. Traces 210, 212 show a minimum and maximum range for a second or maximum phase variability.

An increase to a maximum phasor $\phi_{max}$ that is applied when determining the distortion d, can lead to a distortion function with a phase trajectory potentially positive without a crossing of the real zero axis. The same analogy holds true for a minimum phasor $\phi_{min}$. A phase characterization of the transmission line is determined to properly orient the distortion function in the complex plane. Known length of the transmission line does not alone allow for the proper orientation of the distortion function. This phase characterization is a function of transmission line length l and velocity of propagation $V_p$.

The feedforward adaptations disclosed herein allow for less intrusive or manual inputs. For example, the feedforward adaptations do not include manually entry of a transmission line phasor or manual initiation of a calibration procedure. The feedforward adaptations and associated methods include an efficient phasor estimator without user intervention.

Figure 7:
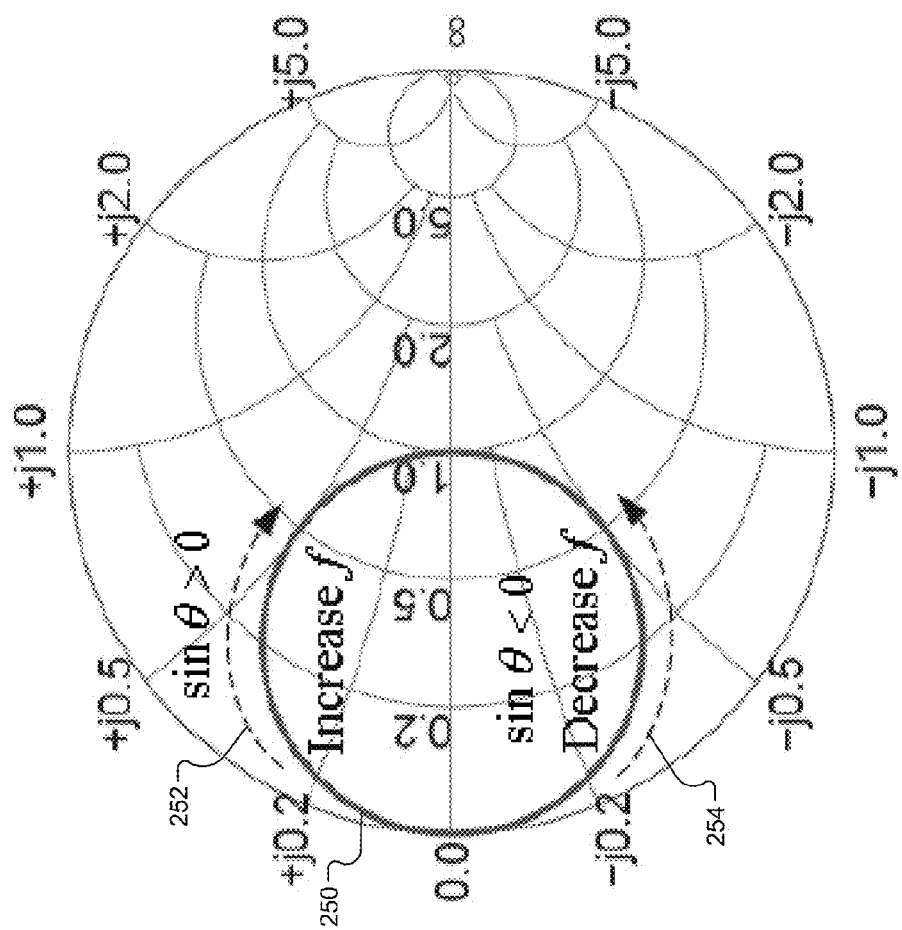
FIG. 7 is a Smith chart illustrating conductance circle and frequency tuning with respect to power distortion in accordance with the present disclosure.

FIG. 7 shows a Smith chart illustrating a conductance circle 250 and frequency tuning with respect to power distortion. The Smith Chart in FIG. 7 illustrates a feedforward control strategy for frequency tuning, which may be used by, for example, the frequency control module 118 of FIG. 4. The conductance circle 250 is strategically located in the Smith Chart such that $d_r>0$, the frequency f of a RF generator is increased to the point where $d_r=0$ (shown by arrow 252). In a similar manner, if $d_r<0$, the frequency of the RF generator is decreased until $d_r=0$ (shown by arrow 254). When $d_r=0$, the condition of maximum RF power transfer occurs.

Correction to the frequency f of the RF generator is determined by coefficient terms of the frequency control module 118. The following disclosed techniques include autonomous adaptation (i) of the proper conductance circle orientation, and (ii) formulation of coefficients of the frequency control module 118 for different operating conditions and variants of the corresponding RF power system. The following disclosed techniques include automated procedures to auto-adjust the phasor $\phi$ for properly orienting the conductance circle 250 and adapting the coefficients of the frequency control module 118 for improved feedforward performance.

Orientation of the Conductance Circle

The conductance circle 250 is located in a left-hand plane of the Smith Chart and oriented with a center of the conductance circle 250 on a negative real axis. This is an ideal location for the conductance circle 250 because the trajectory of the distortion d (also referred to as "the distortion function") includes an odd and symmetric imaginary quantity sine. An odd function is mathematically defined as a function for which $f(x)=-f(-x)$. An odd and symmetric function is used by one or more of the control modules 64, 118 and based on the imaginary quantity $\sin\theta$ to correct the distortion d of the RF power system. This includes adjusting the frequency f of the RF generator and/or the tune element of the matching network.

The transmission line variation (e.g., changes in transmission line length, frequency and velocity of propagation) as indicated by trace 200 of FIG. 6 can have an adverse effect on the orientation of the conductance circle 250. This can be addressed by (i) manual entry of phase $\phi$, or (ii) performance of a calibration and/or estimation procedure to correct the phase $\phi$ impinged on the orientation of the conductance circle 250 by the transmission line. The transmission line (i.e., cable) phasor $\hat\phi$ may be estimated and used to determine a distortion correction $d_c=de^{-j(\hat\phi+\pi)}$ such that the trajectory path of the distortion correction $d_c$ is contained in the left-hand plane of FIG. 6. The rotational effect of the transmission line is a function of the length l of the transmission line, the velocity of propagation $V_p$ of the transmission line, and the applied frequency f. Any of these parameters can alter the orientation of the conductance circle 250 and thereby prevent the distortion function from being an odd function for maximum power transfer.

Transmission line effects are described as an exponential function $e^{\gamma l}=e^{l\alpha}e^{jl\beta}$ where $\alpha$ is an attenuation constant per meter of the transmission line, $\beta$ is a phase constant $\beta=g(V_p, f)$ per meter of the transmission line, $\gamma=\alpha+j\beta$ and g identifies a function. With any variant to the parameters l and $\beta$, the orientation of the conductance circle 250 rotates by a proportional amount or phase $\phi$. The calibration process estimates the phase $\phi$, which may be an approximation of $l\beta$.

In another implementation, the phase (or phasor) $\phi$ is estimated while alleviating the calibration process manual input and/or adjustment of the $\phi$. An estimation procedure is performed that adapts the phasor $\phi$ in an automated and autonomous manner that does not require manual input and/or adjustment of the phasor $\phi$ each time a variation to the transmission line occurs. Two estimation procedures for the phasor $\phi$ are disclosed with respect to FIGS. 9 and 10 and may be performed by the distortion module 44 (example of which is provided in FIG. 8).

Both the distortion function and corresponding conductance circle can be described in geometric terms as a parabolic or circular function with an offset translation $\sigma$ from an origin (0,0) of, for example, the Smith Chart of FIG. 7. The offset translation $\sigma$, which is equal to $e^{j\phi}$ has a phase angle that is equivalent to the phasor $\phi$ of the transmission line. The phasor $\phi$ refers to a rotation angle of the conductance circle about the origin (0,0). By inspection of the conductance circle (shown in FIG. 7), the transmission line phasor and the phase angle of the offset translation $\sigma$ is $\pi$.

Based on this, the $i^{th}$ quantity of the distortion function can be represented as $d_i=\xi e^{j\phi_i}+\sigma$, where $\phi_i=\phi_g(q_i-+q_T)+\phi_o$. This characterizes the $i^{th}$ phase relationship for the first order distortion function, parameterized by the terms $\phi_g$ and $\phi_o$ terms. The relationship for $\phi_i$ is a linearization of the conductance circle, where $\phi_g$ indicates a point on the conductance circle. The term $\phi_g$ may be referred to as a gain term. Rotation of the distortion function occurs at $\phi_g$ radians per step with the initial offset of $\phi_o$. The variable q expresses the angular position for respective frequency f or tune capacitor position $p_t$ values, where q is directly related and/or analogous to frequency f or a tune capacitor position $p_t$ for respective control modules 64, 118 and $q_T$ demarcating the angular position that will achieve a tune condition for maximum power transfer. An attenuation or scaling term $\xi$ is included in the distortion function $d_i$ to indicate it is unnecessary for the function to have unity magnitude. The distortion function $d_i$ is the time index of the distortion $d_t$, where i is an index value that maps $q_i$ to a particular distortion value $d_i$.

In summary, the distortion curve with impairment of the transmission line phasor is defined as $d_i=\xi e^{j\phi_i}+\sigma$. The first derivative of this function is represented by equations 18-20.

$$\dot{d}_i=d_i-d_{i-1} \tag{18}$$

$$\dot{d}_i=(\xi e^{j\phi_i}+\phi)-(\xi e^{j\phi_{i-1}}+\phi) \tag{19}$$

$$\dot{d}_i=\xi(e^{j\phi_i}-e^{j\phi_{i-1}}) \tag{20}$$

The first derivative removes the offset translation $\sigma$ of the distortion that results from the transmission line $\phi$. The derivative of the distortion $\dot{d}_i$ circumscribes the origin (0,0) and the orientation of the derivative $\dot{d}_i$ is independent of the transmission line impedance. If K samples of the derivative $\dot{d}_i$ are obtained, an estimate of the offset translation $\hat\sigma$ can be determined using a least square method. The method of FIG.

9 includes obtaining the K samples and determining the offset translation σ based on the K samples.

Figure 8:
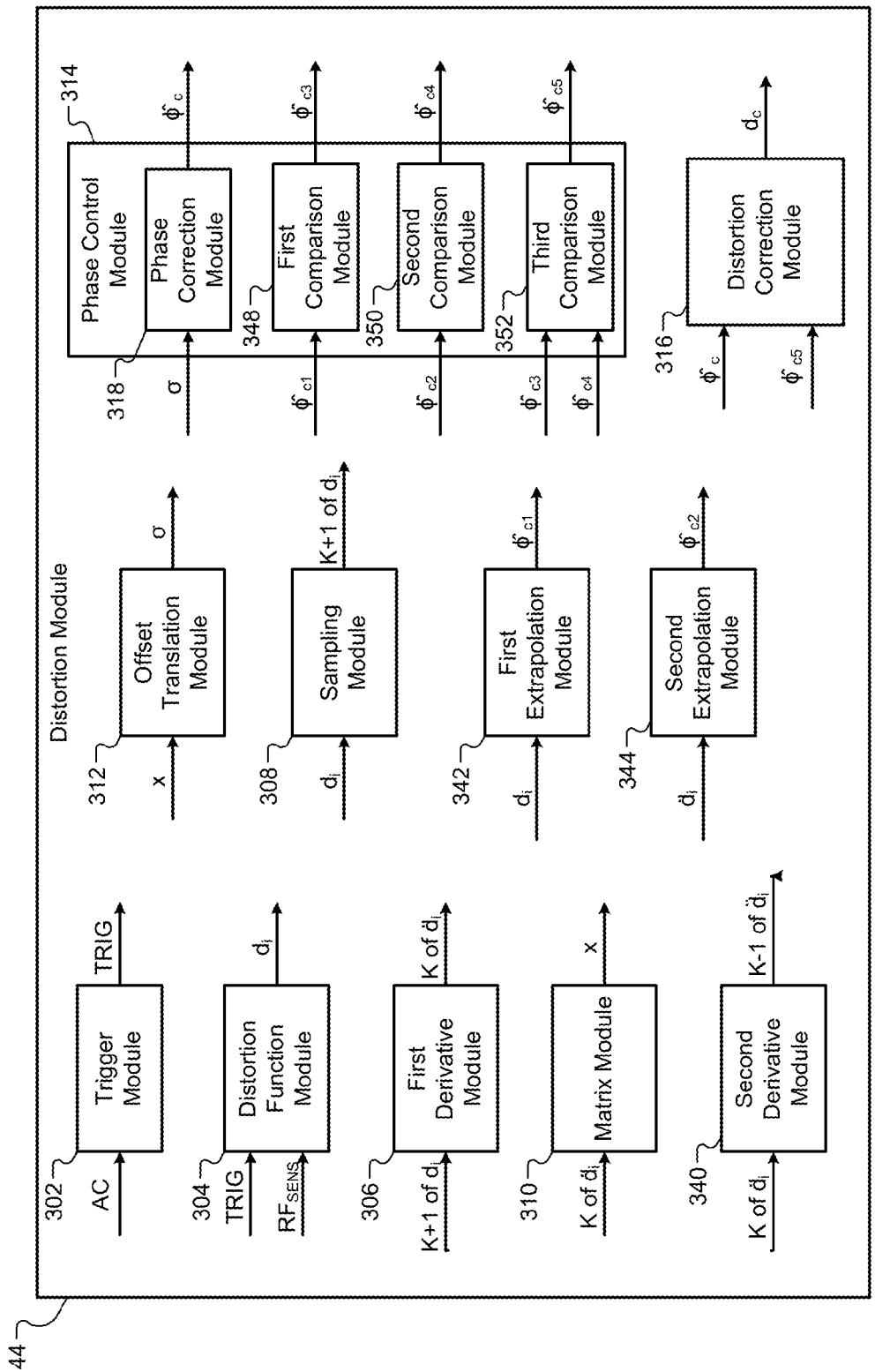
FIG. 8 is a functional block diagram of a distortion module in accordance with the present disclosure.

FIG. 8 shows the distortion module 44, which may be used to replace the distortion module 44 of FIGS. 3-4. The distortion module 44 includes a trigger module 302, a distortion function module 304, a first derivative module 306, a sampling module 308, a matrix module 310, an offset translation module 312, a phase control module 314 and a distortion correction module 316. The phase control module 314 includes a phase correction module 318. These modules are described with respect to the method of FIG. 9 and/or 10 below.

Figure 9:
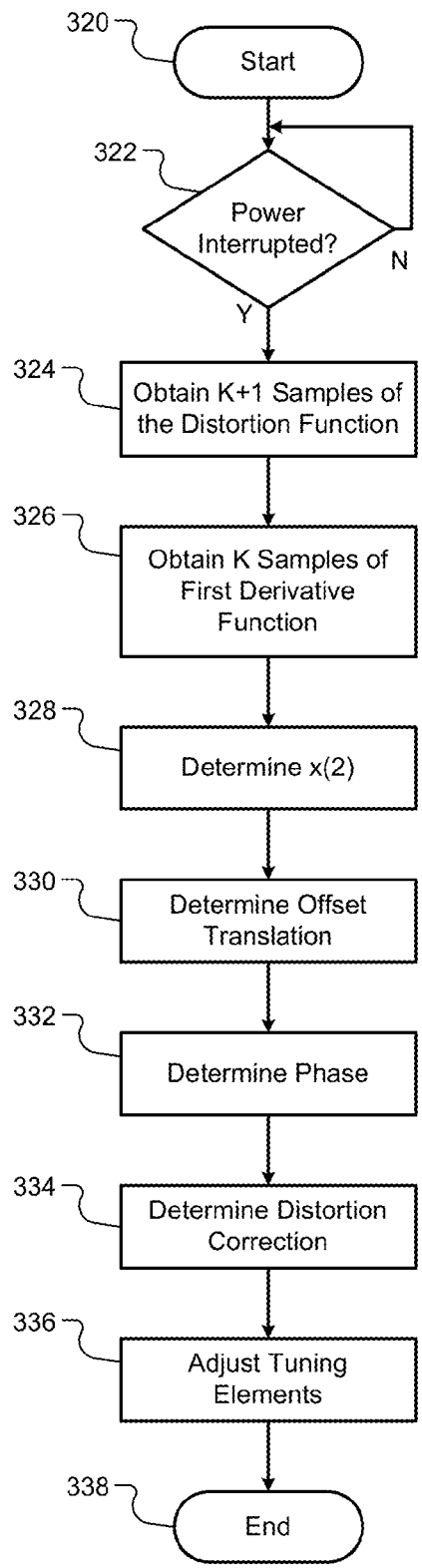
FIG. 9 illustrates a single derivative based distortion correction method in accordance with the present disclosure.

FIG. 9 illustrates a single derivative based distortion correction method. Although the following tasks are primarily described with respect to the implementations of FIGS. 3-4 and 8-9, the tasks may be easily modified to apply to other implementations of the present disclosure. The tasks may be iteratively performed. The method of FIG. 9 may begin at 320.

At 322, the trigger module 302 may determine whether AC power to the RF power system (e.g., one of the RF power systems 10, 100 of FIGS. 3 and 4) and/or to a corresponding RF safety interlock system has been interrupted. If AC power has been interrupted, task 324 is performed. The trigger module 302 may receive a power signal AC indicting whether AC power has been interrupted and generate a trigger signal TRIG to initiate the single derivative based distortion correction method.

At 324, the sampling module 308 obtains K+1 samples of the distortion function $d_t$ based on (i) RF sensor output signals $RF_{SENS}$ from the RF sensors 26, and (ii) the trigger signal TRIG. In one implementation K is 4. K is an integer constant. K+1 samples from $d_t$ are acquired when RF output of the RF generator is enabled with a non-zero setpoint (e.g., the setpoint provided by the power setpoint module 38). The distortion samples are collected as a function of frequency or tune capacitor position.

At 326, the first derivative module determines K samples of the first derivative of the distortion function $\dot{d}_t$. The first derivative module may determine the K samples of $\dot{d}_t$ based on the K+1 samples of $d_t$. From these K samples, the angular rate of change (or velocity) can be used to characterize a distortion curve and adapt feedforward control terms.

In this way, there is no user intervention required and delay time in obtaining the K samples is negligible (e.g., less than 500 µs) to acquire distortion values from frequency operation and process K=4 samples. For matching network tuning, the time to acquire the distortion samples may be (i) greater than time associated with the frequency tuning, and (ii) dependent on motor time constants and communication delays between the matching network and RF power supply. The motor time constants refer to time delays associated with adjusting a tune capacitor position, and a load capacitor position, and/or other impedance elements in a matching network.

At 328, a vector element x(2) is determined using a non-recursive least square method. The vector x is equal to $(A^T A)^{-1} A^T y$, where A is a constructing matrix, and y is a vector. The constructing matrix A has K rows and two columns. The first column has K samples of $\dot{d}_t$. Each entry in the second column is a one. The vector y is a vector containing K samples from $d_t$ in K rows and a single column. The constructing matrix A matrix and vector y are constructed to formulate the least squares estimate of vector x. In one implementation, the vector x is a 2-by-1 matrix having 2 rows and 1 column, where x(2) refers to the second term in the 2-by-1 matrix. Although a non-recursive least squares method is used, a recursive least square estimate may be used.

At 330, from the vector x, the offset translation module 312 estimates the offset translation $\hat{\sigma}$, which is equal to x(2).

At 332, the phase control module estimates the phase $\hat{\phi}$ based on the offset translation $\hat{\sigma}$ and according to equation 21. Phasor estimates may be determined for cables of various lengths, whether an initial matching network condition was tuned or not-tuned.

$$\hat{\phi} = \tan^{-1}\left(\frac{\text{Im}(\hat{\sigma})}{\text{Re}(\hat{\sigma})}\right) = \tan^{-1}\left(\frac{\text{Im}(x(2))}{\text{Re}(x(2))}\right) \approx l\beta \quad (21)$$

At 334, the distortion correction module 316 determines a distortion correction $d_c$ to rotate the distortion d to the desired left-hand plane and construct an odd function for corresponding imaginary components of the distortion d. The corrected distortion function $d_c = d e^{j\hat{\phi}_c}$ is used to determine the distortion correction $d_c$, where $\hat{\phi}_c = -(\hat{\phi} + \pi)$. After the estimation and subsequent correction of distortion is performed, the control modules 64, 118 and corresponding circuitry may proceed to operate as previously described.

At 336, the corrected distortion $d_c$ is then used as the distortion value for $d_t$ to generate the frequency tuning value $u_{ff}^f$ and the impedance tuning value $u_{ff}^t$. The method may end at 338.

Figure 10:
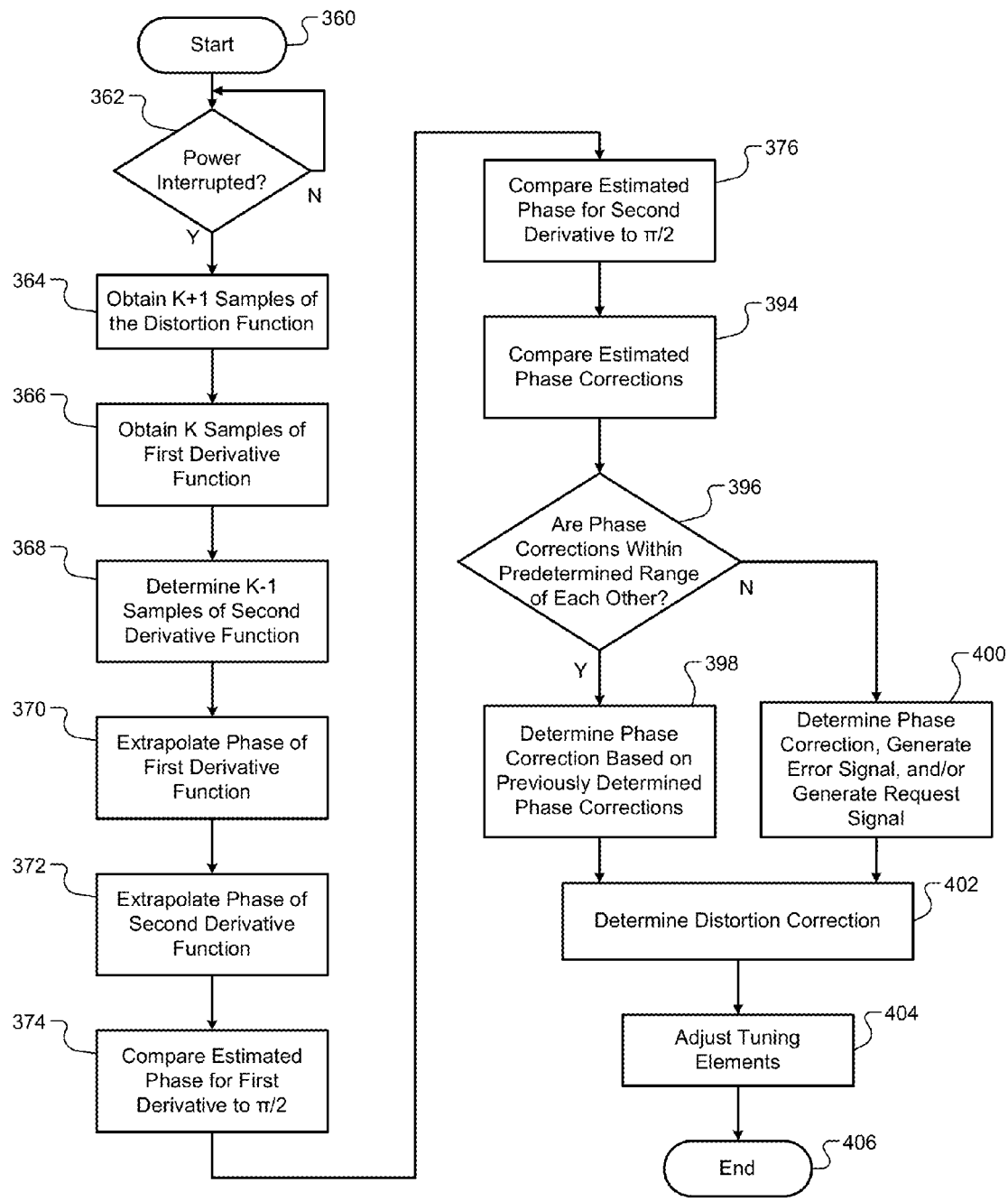
FIG. 10 illustrates a double derivative based distortion correction method in accordance with the present disclosure.

Referring now to FIGS. 8 and 10. The distortion module 44 may further include a second derivative module 340, a first extrapolation module 342, and a second extrapolation module 344. The phase control module 314 may further include a first comparison module 348, a second comparison module 350, and a third comparison module 352.

FIG. 10 illustrates a double derivative based distortion correction method. The method of FIG. 10 may be used as an alternative to and/or in addition to the method of FIG. 9. Although the following tasks are primarily described with respect to the implementation of FIGS. 3-4, 8 and 10, the tasks may be easily modified to apply to other implementations of the present disclosure. The tasks may be iteratively performed and may be performed as described above. The method may begin at 360.

At 362, the trigger module 302 may determine whether AC power to the RF power system (e.g., one of the RF power systems 10, 100 of FIGS. 3 and 4) and/or to a corresponding RF safety interlock system has been interrupted. If AC power has been interrupted, task 364 is performed. The trigger module 302 may receive a power signal AC indicting whether AC power has been interrupted and generate a trigger signal TRIG to initiate the double derivative based distortion correction method.

At 364, the sampling module 308 obtains K+1 samples of $d_t$ as a function of frequency and tune capacitor position. K+1 samples from $d_t$ are acquired when RF output of the RF generator is enabled with a non-zero setpoint (e.g., the setpoint provided by the power setpoint module 38).

At 366, the first derivative module 306 determines K samples of the first derivative $\dot{d}_t$. From the K+1 samples of $d_t$, K values of $\dot{d}_t$ are determined. Each derivative of a sinusoidal function produces a phase shift of $$\frac{\pi}{2}.$$

The first derivative $\dot{d}_t$ has the offset translation removed and provides a reference to At 368, the second derivative module 340 determines K−1 values of a second derivative $\ddot{d}_i$. From the K+1 samples of $d_i$, K−1 values of the second derivative $\ddot{d}_i$ are determined. The method of FIG. 10 includes computation of a second derivative $\ddot{d}_i$ and use of the relationship $q=q_T$. The purpose of the second derivative is for an additional phase datum for a quantitative comparison. The second derivative yields a reference to π. The first and second derivatives provide geometrical datums to compare the angular rotation associated with 1β to a corresponding and predetermined phase.

At 370, the first extrapolation module 342 extrapolates phase of the first derivative $\dot{d}_i$ for $q_T$. The first derivative is extrapolated to the value for d with $q=q_T$. For example, the phase extrapolated from the first derivative provides an estimate of a first phase correction $\hat{\phi}_{c1} = \angle \dot{d}(q=q_T)$.

At 372, the second extrapolation module 344 extrapolates phase of the second derivative $\ddot{d}_i$ for $q_T$. The second derivative is extrapolated to the value for $d_i$ with $q=q_T$. The phase extrapolated from the second derivative provides an estimate of a second phase correction $\hat{\phi}_{c2} = \angle \ddot{d}(q=q_T)$.

At 374, the first comparison module 348 may compare the estimated phase for the first derivative to $$\frac{\pi}{2}$$

to provide a third estimate phase correction $$\hat{\phi}_{c3} = \angle \dot{d}(q=q_T) + \frac{\pi}{2}.$$

At 376, the second comparison module 350 may compare the estimated phase for the second derivative to π to provide a fourth estimate phase correction $\hat{\phi}_{c4} = \angle \ddot{d}(q=q_T) + \pi$.

Figure 11:
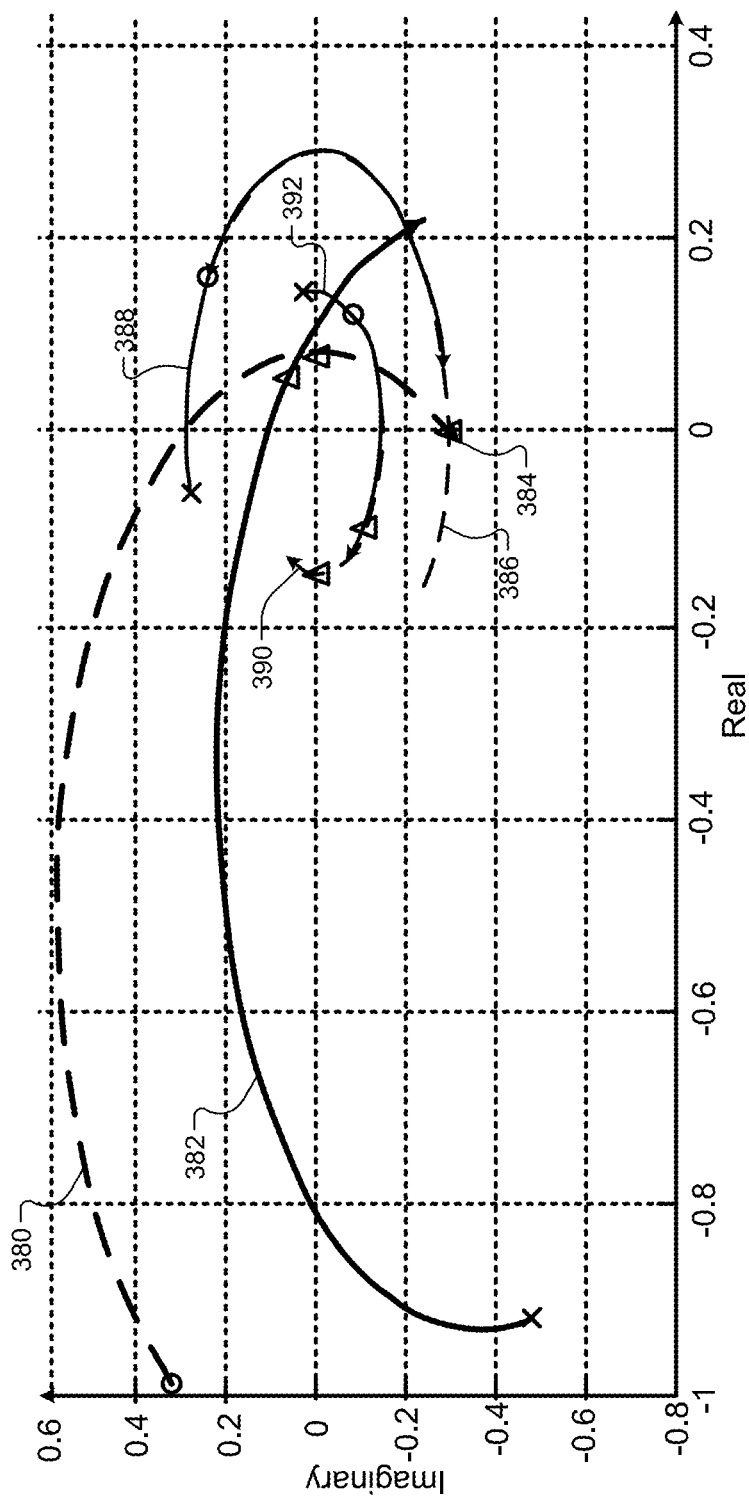
FIG. 11 is a derivative plot of distortion functions in accordance with the present disclosure.

To illustrate the above tasks 370-376, a simulation of a transmission line phasor effect on a distortion function is shown in FIG. 11. FIG. 11 shows a derivative plot of distortion functions. The curve 380 indicates the ideal distortion function and the curve 382 indicates a distortion function due to an effect of an example phasor of an arbitrary transmission line. The example phasor may be, for example, 45.7°. Circle and X symbols on the curves of FIG. 11 indicate a start of a distortion function where q is associated with a minimum frequency or minimum tune capacitor position. The circle symbols are on dashed curves, which are associated with the ideal distortion function. The Xs are on solid curves, which are associated with an arbitrary transmission line. Triangle symbols are included to identify tune positions, where $q=q_T$.

Examining the ideal distortion function and the distortion function of the arbitrary transmission line, a tune point for the ideal distortion function has a zero crossing with a real zero axis. The method of FIG. 10 determines a phasor to apply a correction to the distortion function of the arbitrary transmission line, which is indicated by curve 382 such that a point (indicated by triangle 384) on the curve 382 intersects with the real zero axis. A first derivative of the ideal distortion function is indicated by curve 386. A first derivative of the distortion function of the arbitrary transmission line is indicated by curve 388. Magnitudes of the derivative functions are scaled for the sole purpose of generating a suitable presentation of the original distortion functions along with the corresponding derivative functions. Visually comparing the triangle locations on the curves 386, 388 of the first derivative functions, the ideal derivative function crosses the imaginary axis leading the derivative function of the arbitrary transmission line by approximately 45°.

A second derivative of the ideal distortion function is shown by curve 390. A second derivative of the distortion function for the arbitrary transmission line is shown by curve 392. The curve 390 crosses the real axis leading the curve 392 by 45°. The simulation produced estimates of phase correction $\hat{\phi}_c = 45.75°$ for the first derivative and phase correction $\hat{\phi}_c = 45.68°$ for the second derivative, corroborating with the visual estimates and expected result.

As another example, a transmission line may have a length of 2.5 ft., a transmission line phasor of 18° at 13.56 MHz. For the first derivative, an estimate phase correction may be $\hat{\phi}_c = 108° \pm 90° = 198°$, and based on the second derivative an estimate phase correction may be $\hat{\phi}_c = 18° \pm 180° = 198°$. Illustrating that an estimate phase correction may be based on the first derivative and/or the second derivative.

The extrapolation from the second derivative may provide a more precise phasor for the transmission line than the first derivative. For this reason, the second derivative may be used to ensure an accurate estimate of phase correction is obtained.

At 394, the third comparison module 352 may compare the third estimate of phase 2-$k$ correction $\hat{\phi}_{c3}$ to the fourth estimate of phase correction $\hat{\phi}_{c4}$. A quantitative comparison is made to ensure $$\hat{\phi}_c = \angle \dot{d}(q=q_T) + \frac{\pi}{2} = \angle \ddot{d}(q=q_T) + \pi.$$

The estimates may be recalculated if the third estimate of phase correction $\hat{\phi}_{c3}$ is not within a predetermined range of the fourth estimate of phase correction $\hat{\phi}_{c4}$.

At 396, the phase control module 314 and/or the third comparison module 352 proceeds to task 398 if the third estimate of phase correction $\hat{\phi}_{c3}$ is within a predetermined range of fourth estimate of phase correction $\hat{\phi}_{c4}$, otherwise task 400 is performed.

At 398, the phase control module 314 and/or the third comparison module determines a fifth estimate of phase correction $\hat{\phi}_{c5}$ based on the third and fourth estimate of phase correction do $\hat{\phi}_{c3}$, $\hat{\phi}_{c4}$. The fifth estimate of phase correction $\hat{\phi}_{c5}$ may be, for example, set equal to one of the third and fourth estimate of phase correction $\hat{\phi}_{c3}$, $\hat{\phi}_{c4}$ or may be an average of third and fourth estimate of phase correction $\hat{\phi}_{c3}$, $\hat{\phi}_{c4}$.

At 400, if the third estimate of phase correction $\hat{\phi}_{c3}$ is not within a predetermined range of the fourth estimate of phase correction $\hat{\phi}_{c4}$, the phase control module 314 and/or the third comparison module 352 may generate an error signal, default to the method of FIG. 9, use a predetermined estimate of phase correction, and/or request manual input of a phase correction. Task 402 may be performed subsequent to task 400.

At 402, the distortion correction module 316, based on the fifth estimate of phase correction $\hat{\phi}_{c5}$ or an estimate of phase correction as determined at 400, determines a distortion correction $d_c$ to rotate the distortion d to the desired left-hand plane and construct an odd function for corresponding imaginary components of the distortion d. To rotate d to the desired left-hand plane, the corrected distortion function may be obtained from $d_c = de^{j\hat{\phi}_c}$. After the estimation and subsequent correction of distortion is performed, the control modules 64, 118 and corresponding circuitry may proceed to operate as previously described.

At 404, the corrected distortion $d_c$ is then used as the distortion value for $d_t$ to generate the frequency tuning value $u_{ff}^f$ and the impedance tuning value $u_{ff}^t$. The method may end at 406.

Figure 12:
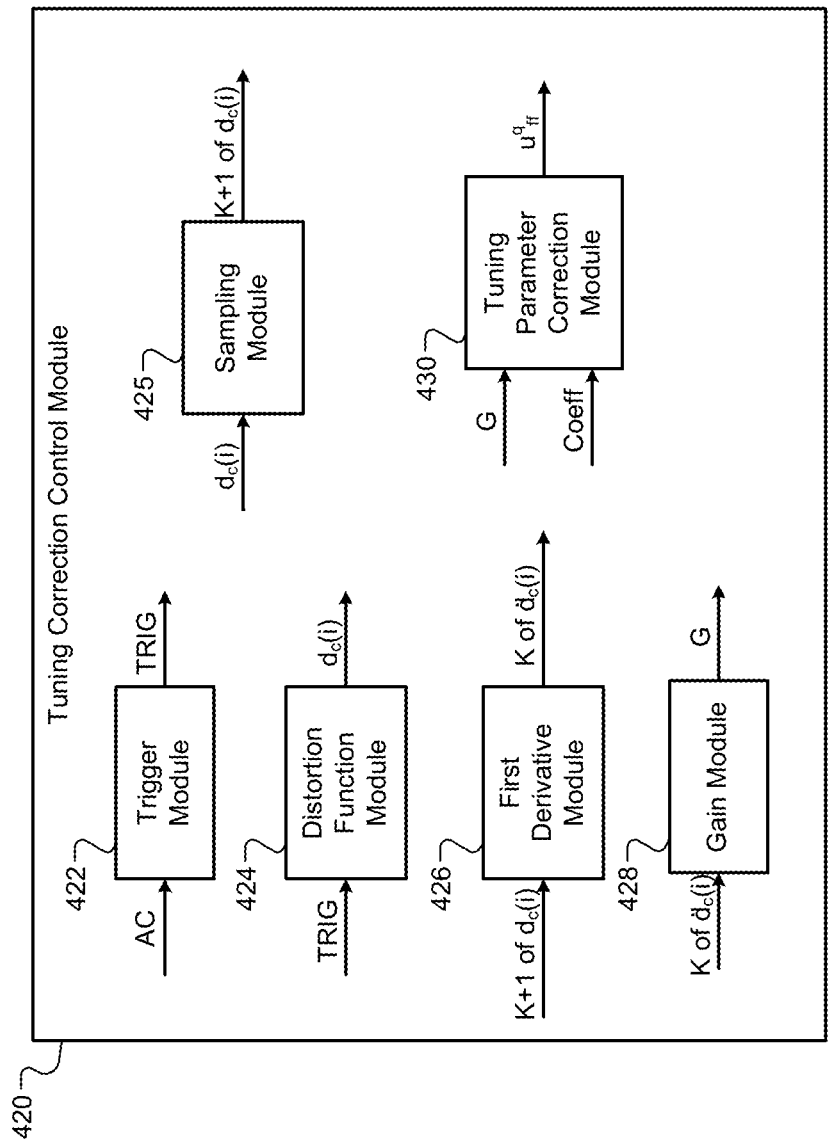
FIG. 12 is a functional block diagram of a tuning correction control module in accordance with the present disclosure.

FIG. 12 shows a functional block diagram of a tuning correction control module 420. The tuning correction control module 420 may replace one of the control modules 64, 118 of FIGS. 3-4. The tuning correction control module 420 may be used to determine one of the frequency tuning value $u_{ff}^f$ and the impedance tuning value $u_{ff}^t$. The tuning correction control module 420 may determine these values for tasks 336, 404 of the above-described methods of FIGS. 9 and 10. The tuning correction control module 420 may include a trigger module 422, a distortion function module 424, a sampling module 425, a first derivative module 426, a gain module 428, and a tuning parameter correction module 430. The modules of the tuning correction control module 420 are described with respect to the method of FIG. 13.

The control modules 64, 118 of FIGS. 3-4 are allocated to respectively adjusting frequency of a RF generator and a tune capacitor position in a matching network. The objective of these control modules is to correct impedance seen by the RF generator to achieve maximum RF power transfer. The responses of the control modules 64, 118 are based on (i) limitations of a frequency response of a power amplifier in the case of the control module 64, and (ii) actuator (e.g., motor) time constants and communication latencies in the case of the control module 118. The responses may not take into account a resolution of impedance tune space. The feedforward adjustments made by the control modules 64, 118 target corrections to remove a distortion; the distortion prevents a condition for maximum RF power transfer that may not be compensated by a feedback control method. By knowing the resolution of the tune space, the coefficients of the control modules 64, 118 can be adjusted for a single step correction.

Unfortunately, the elements of matching networks vary and often are not precisely known for each load. For this reason, an auto-adaption procedure is disclosed below that tailors coefficient terms of the control modules 64, 118 to align with an impedance tune space by accounting for resolution of the impedance tune space. Similar to the estimation procedures of FIGS. 9 and 10 described for determining a phasor of a transmission line, the auto-adaption procedure is based on derivatives of a distortion function.

A first derivative of the distortion function is analogous to angular velocity and provides the resolution of the impedance tune space. The resolution of the impedance tune space is directly related to $\phi_g$, which is an unknown parameter that may be determined and/or accounted for as described below. The parameter $\phi_g$ is an angular position parameter that indicates where a distortion value is on a distortion curve for a transmission line. For a certain change in an impedance actuator (e.g., a change in the frequency or tune capacitor position), there is a notable change in distortion. By producing derivatives of the distortion function with quantifiable control of the impedance actuators, the actual impedance tune space can be characterized. It is anticipated that this auto-adaption procedure is performed in parallel with operations of the control modules 64, 118 and the adapted terms (e.g., coefficient terms) of the control modules 64, 118 are used by the control modules 64, 118 to generate the frequency tuning value $u_{ff}^f$ and the impedance tuning value $u_{ff}^t$.

Figure 13:
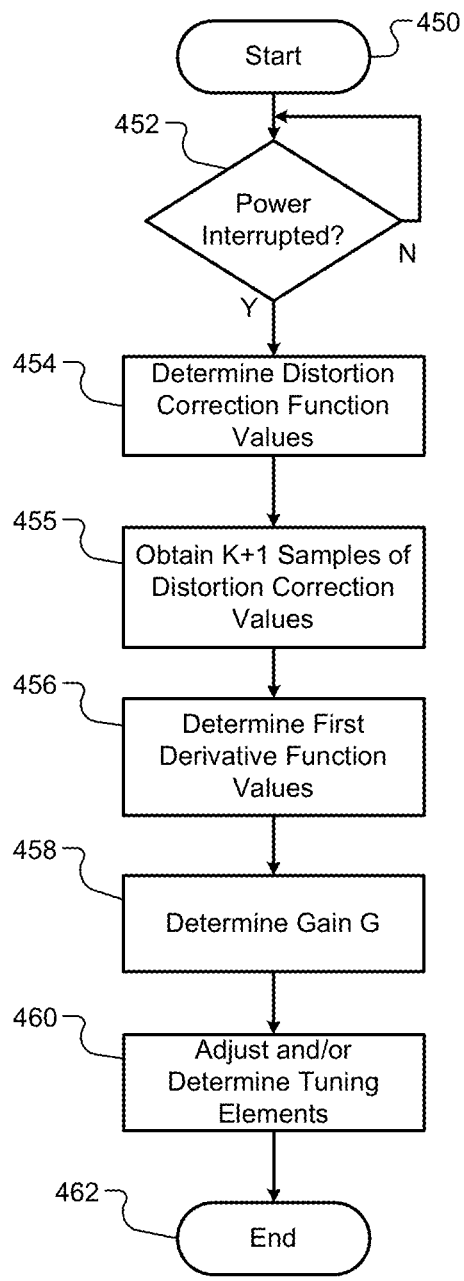
FIG. 13 illustrates a distortion correction based control method in accordance with the present disclosure.

FIG. 13 illustrates a distortion correction based control method. Although the following tasks are primarily described with respect to the implementation of FIGS. 3-4 and 12, the tasks may be easily modified to apply to other implementations of the present disclosure. The tasks may be iteratively performed and may be performed as described above. The method may begin at 450.

At 452, the trigger module 422 may determine whether AC power to the RF power system (e.g., one of the RF power systems 10, 100 of FIGS. 3 and 4) and/or to a corresponding RF safety interlock system has been interrupted. If AC power has been interrupted, task 354 is performed. The trigger module 422 may receive a power signal AC indicting whether AC power has been interrupted and generate a trigger signal TRIG to initiate the distortion correction based control method.

At 454, the distortion function module 424 determines distortion correction values for a distortion correction function $d_c(i) = \xi e^{j\Phi_c}$ based on the impedance and distortion relationships $$z = \frac{\vec{v}}{\vec{i}} = |z|e^{j\theta}$$

and $$d_c(i) = \frac{\vec{z}}{|z|} = e^{j\theta}.$$

At 455, the sampling module 425 obtains K+1 samples of the distortion correction values.

At 456, first derivative module 426 determines, for example, K first derivative correction values based on the K+1 samples of the distortion correction values. The first derivative module 426 may determine a first derivative function of the distortion correction function based on an expanded distortion correction function. The K first derivative correction values may be provided in terms of cos θ and sinθ. The distortion correction function may be expanded as provided by equation 22. The first derivative function may then be represented by equation 23.

$$d(i) = \xi e^{j\Phi i} = \xi \cos(\phi_g(q_i - q_T) + \phi_o) + j\xi \sin(\phi_g(q_i - q_T) + \phi_o) \quad (22)$$

$$\dot{d}_c(i) = \partial d/\partial q = -\xi \phi_g \sin(\phi_g(q_i - q_T) + \phi_o) + j\xi \phi_g \cos(\phi_g(q_i - q_T) + \phi_o) \quad (23)$$

Trigonometric identities $$-\sin(x) = \cos\left(x + \frac{\pi}{2}\right)$$

and $$\cos(x) = \sin\left(x + \frac{\pi}{2}\right)$$

may be applied to equation 23 to provide equation 24.

$$\dot{d}_c(i) = \xi \varphi_g \cos\left(\varphi_g(q_i - q_T) + \varphi_o + \frac{\pi}{2}\right) + j\xi\varphi_g \sin\left(\varphi_g(q_i - q_T) + \varphi_o + \frac{\pi}{2}\right) \quad (24)$$

At 458, the gain module 428 may determine a gain value G (first coefficient term) based on the K first derivative correction values. The inverse of the first derivative $\dot{d}_c(i)$ is assigned to the gain term. The gain G may be determined based on an inverse of, for example, one or more of the K first derivative correction values. The gain term may be represented as provided by equation 25. Equation 24 is in rectangular form and may be converted to equation 25, which is in polar form by taking the inverse of $\dot{d}_c(i)$.

$$G = \frac{1}{\xi\varphi_g} e^{-j(\varphi_g(q_i - q_T) + \varphi_o + \frac{\pi}{2})} = \frac{1}{\xi\varphi_g} e^{-j(\varphi_i + \frac{\pi}{2})} \quad (25)$$

The variable $\phi_g$ may be accounted for by determining the gain G based on the K first derivative correction values and/or may be determined using equation 25 and the determined value for the gain G.

At 460, the tuning parameter correction module 430 determines the frequency tuning value $u_{\mathit{ff}}^f$ and/or the impedance tuning value $u_{\mathit{ff}}^t$ based on the gain G. Each of the control modules 64, 118 can be generalized as provided by equation 26, where the parameter q represents (i) the frequency f for the control module 64, and (ii) the tune parameter t (or tune capacitor position) for the control module 118. The gain term G is different for each of the control modules 64, 118, as the terms $q_i$ and $q_T$ are analogous to frequency for the control module 64 and to tune capacitor position for the control module 118.

$$u_{\mathit{ff}}^q(i+1) = u_{\mathit{ff}}^q(i) - [G(\alpha_q d_c(i) + \beta_q d_c(i-1) + \gamma_q d_c(i-2))] \quad (26)$$

By applying the gain G according to equation 26, the coefficient terms $\alpha_q, \beta_q, \gamma_q$, are modified by the gain G. The method may end at 462.

The above-described tasks of FIGS. 9-10 and 13 are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

Although the terms first, second, third, etc. may be used herein to describe various elements, components, loops, circuits, and/or modules, these elements, components, loops, circuits, and/or modules should not be limited by these terms. These terms may be only used to distinguish one element, component, loop, circuit or module from another element, component, loop, circuit or module. Terms such as "first," "second," and other numerical terms when used herein do not imply a sequence or order unless clearly indicated by the context. Thus, a first element, component, loop, circuit or module discussed herein could be termed a second element, component, loop, circuit or module without departing from the teachings of the example implementations disclosed herein.

In addition, in the above-described description various variable labels and values are disclosed. The variable labels and values are provided as examples only. The variable labels are arbitrarily provided and may each be used to identify or refer to one or more items. If a variable label is used to refer to more than one item, the items may be unrelated. As an example, the variable label ξ is used to refer to a systematic error and is also used to refer to a scaling term. The systematic error is different than and unrelated to the scaling term. The values are also arbitrarily provided and may vary per application.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A distortion module comprising:
a first module configured to (i) receive radio frequency signals from radio frequency sensors of a power amplifier, and (ii) generate a distortion signal indicating distortion values for the radio frequency signals, wherein the radio frequency signals are indicative of radio frequency power out of the power amplifier and received by a transmission line;
at least one module configured to estimate a phase of the distortion signal, wherein the phase of the distortion signal is indicative of a phase of the transmission line; and a correction module configured to generate a distortion correction signal based on the phase to correct at least one of the distortion values of the radio frequency signals.

2. The distortion module of claim 1, further comprising:
a derivative module configured to, based on the distortion values of the distortion signal, determine derivative values of a derivative of a distortion function or the distortion signal to generate a derivative signal,
wherein the first module is configured to generate the distortion signal based on the distortion function;
a translation module configured to determine an offset translation based on the derivative values of the derivative signal; and
a phase module configured to determine the phase of the distortion signal based on the offset translation.

3. The distortion module of claim 2, further comprising:
a sampling module configured to sample the distortion signal to obtain the distortion values; and
a matrix module configured to generate a matrix based on the derivative values of the derivative signal,
wherein the translation module is configured to generate the offset translation based on the matrix.

4. The distortion module of claim 3, wherein the offset translation is determined based on a least squares estimate of the matrix.

5. The distortion module of claim 4, wherein the matrix module configured to generate the matrix based on:
a predetermined number of samples of the distortion signal; and
a predetermined number of samples of the derivative signal.

6. The distortion module of claim 2, wherein the first module is configured to generate the distortion signal according to at least one of (i) a sinusoidal function of the radio frequency signals and (ii) a cross-correlation function of the radio frequency signals.

7. The distortion module of claim 2, wherein:
the phase module is configured to generate a phase correction signal based on the phase; and
the correction module is configured to generate the distortion correction signal based on the phase correction signal.

8. A radio frequency system comprising:
the distortion module of claim 2;
the power amplifier configured to provide an output to a matching network via the transmission line between the power amplifier and the matching network; and
the radio frequency sensors configured to (i) monitor the output of the power amplifier, and (ii) generate the radio frequency signals.

9. The radio frequency system of claim 8, further comprising a control module configured to (i) generate a impedance tuning value based on the distortion correction signal, and (ii) provide feedforward control of impedance matching performed within the matching network including outputting the impedance tuning value to one of the power amplifier and the matching network.

10. The radio frequency system of claim 9, further comprising a gain module configured to determine a gain value based on the derivative values of the derivative signal to account for a resolution of an impedance tune space associated with the transmission line,
wherein the control module is configured to generate the impedance tuning value based on the gain value.

11. The radio frequency system of claim 10, wherein the control module adjusts coefficients of the impedance tuning value based on the gain value.

12. A distortion module comprising:
a function module configured to (i) receive radio frequency signals from radio frequency sensors of a power amplifier, and (ii) generate a distortion signal indicating distortion values for the radio frequency signals based on a distortion function;
a first derivative module configured to, based on the distortion values of the distortion signal, determine first derivative values of a first derivative of the distortion function or the distortion signal to generate a first derivative signal;
a second derivative module configured to, based on the first derivative values or the first derivative signal, determine second derivative values of a second derivative of the distortion signal to generate a second derivative signal;
a phase module configured to (i) determine a first phase of the first derivative signal and a second phase of the second derivative signal, and (ii) determine a first phase correction value based on the first phase and the second phase; and
a correction module configured to generate a distortion correction signal based on the first phase correction value.

13. The distortion module of claim 12, further comprising:
a first comparison module configured to compare the first phase of the first derivative signal to $\pi/2$ to generate a second phase correction value; and
a second comparison module configured to compare the second phase of the second derivative signal to IT to generate a third phase correction value,
wherein the first phase correction value is generated based on the second phase correction value and the third phase correction value.

14. The distortion module of claim 13, further comprising:
a first extrapolation module configured to extrapolate the first phase of the first derivative signal for an angular position associated with a maximum amount of power transfer from a power generator to a transmission line,
wherein the first comparison module is configured to generate the second phase correction value based on the extrapolated first phase; and
a second phase extrapolation module configured to extrapolate the second phase of the second derivative signal for the angular position associated with the maximum amount of power transfer from the power generator to the transmission line,
wherein the second comparison module is configured to generate the third phase correction value based on the extrapolated second phase.

15. The distortion module of claim 14, further comprising a third comparison module configured to compare the second phase correction value to the third phase correction value to generate the first phase correction value.

16. A radio frequency system comprising:
the distortion module of claim 12;
the power amplifier configured to provide an output to a matching network via a transmission line between the power amplifier and the matching network; and
the radio frequency sensors configured to (i) monitor the output of the power amplifier, and (ii) generate the radio frequency signals.

17. The radio frequency system of claim 16, further comprising a control module configured to (i) generate a first impedance tuning value based on the distortion correction signal, and (ii) provide feedforward control of impedance matching performed within the matching network including outputting the first impedance tuning value to one of the power amplifier and the matching network.

18. The radio frequency system of claim 17 further comprising a gain module configured to determine a gain value based on the derivative values of the derivative signal to account for a resolution of an impedance tune space associated with the transmission line, wherein the control module is configured to generate the impedance tuning value based on the gain value.

19. The radio frequency system of claim 18, wherein the control module is configured to adjust coefficients of the impedance tuning value based on the gain value.

20. A radio frequency system comprising:

a power amplifier configured to output a radio frequency signal to a matching network via a transmission line between the power amplifier and the matching network;

a sensor configured to monitor the radio frequency signal and generate first sensor signals based on the radio frequency signal;

a distortion module configured to determine distortion values according to at least one of (i) a sinusoidal function of the first sensor signals and (ii) a cross-correlation function of the first sensor signals;

a derivative module configured to determine derivative values for a derivative of a distortion function based on the distortion values;

a gain module configured to determine a gain value based on the derivative values to account for a resolution of an impedance tune space associated with the transmission line; and a control module configured to (i) generate an impedance tuning value based on the distortion values and the gain value, and (ii) provide feedforward control of impedance matching performed within the matching network including outputting the impedance tuning value to one of the power amplifier and the matching network.

21. The radio frequency system of claim 20, wherein the power amplifier is configured to adjust frequency of the radio frequency signal to the matching network based on the impedance tuning value.

22. The radio frequency system of claim 20, further comprising the matching network, wherein the matching network is configured to adjust an impedance in the matching network based on the impedance tuning value.

* * * * *